(12) United States Patent
Schildbach et al.

(10) Patent No.: US 8,798,776 B2
(45) Date of Patent: Aug. 5, 2014

(54) TRANSCODING OF AUDIO METADATA

(75) Inventors: Wolfgang Alexander Schildbach, Nuremberg (DE); Kurt Michael Krauss, Nuremberg (DE)

(73) Assignee: Dolby International AB (NL)

( * ) Notice: Subject to any disclaimer, the term of this patent is extended or adjusted under 35 U.S.C. 154(b) by 444 days.

(21) Appl. No.: 12/556,788

(22) Filed: Sep. 10, 2009

(65) Prior Publication Data

US 2010/0083344 A1    Apr. 1, 2010

Related U.S. Application Data

(60) Provisional application No. 61/101,497, filed on Sep. 30, 2008.

(51) Int. Cl.
*G06F 17/00* (2006.01)

(52) U.S. Cl.
USPC .......................................................... 700/94

(58) Field of Classification Search
USPC ......... 700/94; 709/231, 246; 369/4; 381/119, 381/98–109; 704/500–504
See application file for complete search history.

(56) References Cited

U.S. PATENT DOCUMENTS

2006/0242325 A1* 10/2006 Ramaswamy et al. ........ 709/246

FOREIGN PATENT DOCUMENTS

| CN | 1933523 | 3/2007 |
|---|---|---|
| CN | 101067931 | 11/2007 |
| JP | 2001-282261 A | 10/2001 |
| TW | 200531006 A | 9/2005 |
| TW | 200608351 A | 3/2006 |
| TW | 200638336 A | 11/2006 |
| TW | 200746871 A | 12/2007 |
| TW | 200822062 A | 5/2008 |

OTHER PUBLICATIONS

Schildbach, W., et al., "Transcoding of dynamic range control coefficients and other Metadata into MPEG-4 HE AAC" 123rd Convention of the Audio Engineering Society AES, Paper 7217, Oct. 5, 2007.
Intl Searching Authority, "Notification of Transmittal of the Intl Search Report and the Written Opinion of the Intl Searching Authority, or the Declaration", mailed Feb. 12, 2009, for Intl Application No. PCT/US2009/057251.
Schildbach, Wolfgang, "Transcoding of dynamic range control coefficients and other Metadata into MPEG-4 HE AAC", AES 123rd Convention, New York, NY Oct. 5, 2007, Convention Paper 7217, pp. 1-8.

(Continued)

*Primary Examiner* — Andrew C Flanders
(74) *Attorney, Agent, or Firm* — Weaver Austin Villeneuve & Sampson, LLP

(57) ABSTRACT

The invention relates to the field of audio encoding. In particular, it relates to the transcoding of audio metadata between different audio coding schemes. It describes a method and a system for transcoding audio gain metadata related to dynamic range control from first gain metadata of a first audio coding scheme to second gain metadata of a second audio coding scheme, wherein the first and second audio coding schemes use coding blocks and wherein each coding block has at least one associated gain value. The method and the system select a gain value of the second gain metadata based on the gain values of the first gain metadata such that within a time interval around the time instance associated with the gain value of the second gain metadata, the minimum gain value of the first gain metadata is selected.

30 Claims, 7 Drawing Sheets

(56) References Cited

OTHER PUBLICATIONS

European Patent Office, International Search Report mailed Feb. 12, 2009.

Fielder, Louis D. et al., "Introduction to Dolby Digital Plus, an Enhancement to the Dolby Digital Coding System," Convention Paper 6196, Audio Engineering Society 117$^{th}$ Convention, Oct. 28-31, 2004, pp. 1-29, XP002322553.

Office Action and Search Report dated Sep. 18, 2013 issued in Taiwanese Application No. 098131941.

* cited by examiner

TRANSCODING OF AUDIO METADATA

CROSS REFERENCE TO RELATED APPLICATION

This application claims priority to U.S. Provisional Patent Application No. 61/101,497, filed 30 Sep. 2008, hereby incorporated by reference in its entirety.

FIELD OF THE INVENTION

The invention relates to the field of audio encoding. In particular, it relates to the transcoding of audio metadata between different audio coding schemes.

BACKGROUND OF THE INVENTION

With the increasing proliferation of digital TV and radio systems, metadata, i.e. "data about data", intended to guide receiver-side control of program loudness and dynamic range as well as controlling stereo downmix is taking on increasing importance. Because the emission format or the transmission format of audio data is not necessarily the same as the production or the contribution format, i.e. the encoding scheme used during the creation or the post-processing of the audio signal, means must be found to transcode the metadata from one format to another. With the introduction of the audio codec HE AAC, which is also known as aacPlus, into several new broadcasting systems, the topic of how to best encode new metadata and how to transcode pre-existing metadata into and from HE AAC needs to be addressed.

The HE AAC (High Efficiency Advanced Audio Coding) is a state-of-the-Art low-bitrate codec, providing full bandwidth, near CD audio quality at 48 kbps stereo. It has been standardized in MPEG-4 under the HE AAC profile. The profile offers enhanced ways on the optional application of metadata in the decoder in a way that improves upon a number of shortcomings present in the original MPEG-2 AAC definition. In particular, it allows the specification of metadata such as DRC (Dynamic Range Control), DN (Dialog normalization), or downmixing from multichannel to stereo, which is widely used in broadcasting to achieve adequate reproduction of the original program material in particular listening environments.

While codecs such as HE AAC are broadly used in broadcasting, different coding schemes are common on the production side as well as on the receiver side. By way of example, the Dolby E coding scheme is frequently used by content producers, whereas the Dolby Digital coding scheme, which is also referred to as the AC-3 or the Dolby D coding scheme, is frequently used in Theater and Home Theater decoding systems. Consequently, there is a need for the transcoding of audio metadata between the different coding schemes which ensures that metadata which was originally defined at the producing side reaches the final decoding system in a non-deteriorated way. The target is in general to ensure that no or little perceptual differences can be detected by the auditor when comparing the originally encoded audio stream subjected to the originally defined metadata with the received audio stream subjected to the transcoded metadata. The following invention deals with this problem and defines methods for translating metadata from one compressed bitstream format to a different compressed bitstream format, particularly in cases where the framing of the two formats is not compatible.

SUMMARY OF THE INVENTION

The present invention describes a method for transcoding audio gain metadata related to dynamic range control from first gain metadata of a first audio coding scheme to second gain metadata of a second audio coding scheme, wherein the first and second audio coding schemes use coding blocks and wherein each coding block has at least one associated gain value. The method comprises the step of
selecting a gain value of the second gain metadata based on the gain values of the first gain metadata such that within a time interval around the time instance associated with the gain value of the second gain metadata, the minimum gain value of the first gain metadata is selected.

Examples for such first and second coding schemes could be Dolby E, AAC, HE AAC and/or Dolby Digital (Dolby D) and its variants such as Dolby Digital Plus. The first audio coding scheme could also be referred to as a source coding scheme at the input of a metadata transcoder whereas the second audio coding scheme could also be referred to as a target coding scheme at the output of a metadata transcoder. Both coding schemes define metadata associated with the encoded audio signals. Typically, the underlying coding schemes segment the encoded audio signals into coding blocks. Depending on the coding scheme, such coding blocks may contain a different number of encoded signal samples. Furthermore, the coding blocks may also cover different lengths of time of the encoded audio signals. Usually, each coding block has associated metadata which also comprises gain values which are to be applied to the audio signal of the particular coding block. On the other hand, many audio coding schemes apply a so-called sample-and-hold behavior which consists in maintaining a current gain value up to the moment an updated gain value is received. Consequently, in such cases the current gain value is associated with the coding blocks until an updated gain value is received.

According to another aspect of the invention, the time interval for selecting the gain value of the second metadata is defined by an upper and a lower limit. This upper and lower limit is determined by a time constant which is respectively added to and subtracted from the time instance associated with the gain value of the second gain metadata. In other words, in a preferred embodiment the interval is symmetrical around the time instance associated with the gain value of the second gain metadata.

This time constant may be selected such that it is greater or equal to the maximum of the length of time of the coding blocks of the first audio coding scheme and the length of time of the coding blocks of the second audio coding scheme. If the time constant is selected in such a way, then the described method yields transcoded gain values that are resistant to gain overshoots and clipping. Under certain conditions it can be assured that the transcoded gain metadata never exceeds the source gain metadata.

On the other hand, the time constant may also be selected to be smaller than the maximum of the length of time of the coding blocks of the first audio coding scheme and the length of time of the coding blocks of the second audio coding scheme. This may be beneficial, in order to achieve a good matching between the source gain metadata and the target gain metadata.

In certain situations, it may occur that no gain value of the first gain metadata falls within the time interval around the time instance associated with the gain value of the second gain metadata. By way of example, this may occur if the time constant is selected to be rather small or if the length of time of the coding blocks of the second audio coding scheme is smaller than the length of time of the coding blocks of the first audio coding scheme. In such cases, the method may select the gain value of the second gain metadata to be the gain value of the second gain metadata associated with the coding block which precedes the coding block associated with the gain value of the second gain metadata. Alternatively the method may select the gain value of the first gain metadata which precedes the time interval as the gain value of the second gain metadata. In other words, the transcoder may use a sample-and-hold behavior of the audio encoding schemes and maintain current gain values until updated gain values are received.

According to another aspect of the invention, the method may be further adapted for the case that the second audio coding scheme allows the selection of different interpolation curves which interpolate adjacent gain values of the second gain metadata to form a second gain curve. An example of such an audio coding scheme is HE AAC which allows the selection of a linear interpolation curve, which is particularly suited for gain releases, and a plurality of abrupt interpolation curves, which are particularly suited for gain attacks. If the second audio coding scheme provides such functionality, then the method may comprise the further step of selecting an appropriate interpolation curve between two adjacent gain values of the second gain metadata based on the gain values of the first gain metadata.

The appropriate interpolation curve may for example be selected based on the difference between two adjacent gain values of the first gain metadata. If e.g. the first source gain value is (very) high and the next source gain value (very) low, then an "attack" like interpolation curve may be selected. If, on the other hand, the first and the next source gain values are rather similar, then a "release" like interpolation curve may be selected.

Alternatively, if a first gain curve is associated with the gain values of the first gain metadata wherein this first gain curve may be obtained by interpolating adjacent gain values of the first gain metadata, then the appropriate interpolation curve may be selected based on the slope of the first gain curve. In particular, if the negative slope of the first gain curve is above a pre-defined threshold value, then a gain attack may be detected. In other words, if the first gain curve drops steeply, then a gain attack may be detected. On the other hand, if the negative slope of the first gain curve is below a pre-defined threshold value, then a gain release is detected. Based on a detected gain attack or a gain release of the first gain curve the method then selects the appropriate interpolation curve between two adjacent gain values of the second gain metadata.

As already mentioned, the second encoding scheme may allow the selection of a plurality of "attack" interpolation curves which are also referred to as interpolation curve patterns. These different interpolation curve patterns are typically delayed in time to one another and thereby allow the definition of different "attack" times. In order to use this functionality of the second encoding scheme, the method may select the appropriate interpolation curve between two adjacent gain values of the second gain metadata based on the position where the absolute value of the slope of the first gain curve is maximum. In other words, the method determines the steepest point of the first gain curve and selects an interpolation curve pattern of the second encoding scheme, which is closest to this steepest point.

According to a further aspect of the invention, the selection of the gain value of the second gain metadata may not only be based on the set of gain values of the first gain metadata, but on the entire first gain curve. In such cases, the method comprises the step of selecting the minimum value of the first gain curve within the time interval as the gain value of the second gain metadata. This may be particularly useful if no gain value of the first gain metadata falls within the time interval around the time instance associated with the gain value of the second gain metadata.

As a low complexity alternative to calculating the minimum value of the first gain curve it may be beneficial to select the minimum value of a set of samples of the first gain curve within the time interval as the given gain value of the second gain metadata. This set of samples of the first gain curve may comprise the samples of the first gain curve at the time instances of the coding blocks of the second gain values falling within the time interval.

In addition, the invention describes a method for transcoding audio gain metadata related to dynamic range control from first gain metadata of a first audio coding scheme to second gain metadata of a second audio coding scheme, wherein the first and second audio coding schemes have different numbers of audio samples per coding block and wherein each coding block has an associated gain value. Furthermore, a series of gain values of adjacent coding blocks is interpolated to define a gain curve. The method comprises the step of selecting the gain values of the second gain metadata based on gain values of the first gain metadata such that the second gain curve is always below the first gain curve. Using this condition, it can be assured that a source audio signal which is free from clipping is transcoded into a target audio signal, which is also free from clipping.

Furthermore, the invention describes a method for transcoding audio gain metadata related to dynamic range control from first gain metadata of a first audio coding scheme to second gain metadata of a second audio coding scheme, wherein the first and second audio coding schemes use coding blocks and wherein each coding block has an associated gain value. In addition, a second gain curve is associated with the gain values of the second gain metadata. The method comprises the step of selecting the gain values of the second gain metadata such that, at time instances associated with the coding blocks of the first audio coding scheme, the second gain curve is smaller or equal to the gain values of the first gain metadata.

According to another aspect of the invention, the selection of the gain values of the second gain metadata may not only be based on the set of gain values of the first gain metadata, but on the entire first gain curve. In such cases, the method may select the gain values of the second gain metadata such that at time instances associated with the coding blocks of the first audio coding scheme and/or at time instances associated with the coding blocks of the second audio coding scheme the second gain curve is smaller or equal to the first gain curve. This may be beneficial notably when the length of time of the coding blocks of the second audio coding scheme is smaller than the length of time of the coding blocks of the first audio coding scheme.

For certain coding schemes the gain curves consist of segments associated with adjacent gain values and a window function. Typically the curve segments are obtained by interpolating between adjacent gain values using the window function of the coding scheme. In such cases, the above mentioned samples of the gain curves at particular time instances may be determined by the gain values and a set of samples of the window functions. For certain coding schemes the window functions are identical for all or a subset of curve segments, such that the gain curves can be described by the gain values and a limited set of samples of the window function. This allows a low complexity implementation of the described methods, even when basing the gain value selection on the source gain curve.

The invention furthermore describes transcoding systems which implement the above mentioned transcoding methods. These transcoding systems may be part of transmission systems or consumer set-top boxes. The transcoding systems may make use of the processing and memory means provided by surrounding systems, but the transcoding system may also comprise own processing means, such as a CPU, and memory means, such as ROM or RAM.

By way of example, the implementation of an audio transcoding system may comprise a digital processor and memory for storing instructions for execution by the processor. The memory may further store incoming metadata and generated outgoing metadata before transmission. In particular, the gain values of coding blocks may be stored in memory for processing. Furthermore, it is preferred to have samples of the window function or the plurality of window functions of the first and/or second audio coding scheme stored in memory.

An example audio transcoding system may be implemented in a set-top box for transcoding from a transmission audio format to an audio coding scheme used for play back or recording at a consumer's home. By way of example, the transcoding between HE AAC, as a transmission audio coding scheme, and Dolby Digital (Plus), as an emission audio coding scheme used for play back, may be provided in a set-top box.

Another example for an audio transcoding system may be implemented as a head-end for transcoding from a production or contribution audio coding format to a transmission audio format. By way of example, the transcoding between Dolby E, as a production audio scheme, and HE AAC, as a transmission audio scheme, may be provided in such a head-end system.

It should be noted that the methods and systems described in this document may be applied to a variety of first and second audio coding schemes, such as Dolby E, Dolby Digital (Plus), also known as Dolby D or AC-3, AAC (Advanced Audio Coding), and/or HE AAC (High Efficiency AAC), also known as aacPlus.

Furthermore, it should be noted that features of the methods and systems described in this document may be used in combination with one another. Notably, it may be beneficial to employ one method for one transcoding direction and another method for the reverse transcoding direction.

DESCRIPTION OF THE FIGURES

In the following, selected embodiments of the invention are described with reference to the accompanying drawings.

Figure 1:
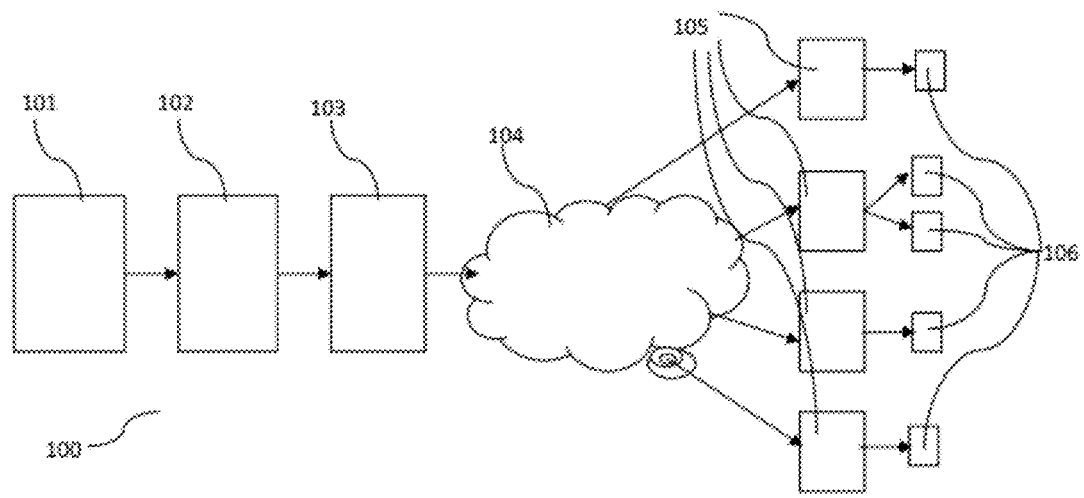
FIG. 1 illustrates a typical transcoding chain.

Metadata is the "data about the audio data" that travels along with the multichannel audio bitstream e.g. in Dolby Digital, Dolby E, AAC, HE AAC or other audio codecs. It removes the need for broadcasters to continuously adjust and compress audio levels depending on the transmitted audio stream. It also provides audio mixers with a high degree of artistic freedom with regards to the acoustic dynamics of audio streams. In the past, broadcasters working with multichannel audio often had problems with soundtracks whose average levels fell above or below that of other programming. Also, issues arose when surround sound content was played back on television sets with stereo or mono audio output. Using audio metadata, sound engineers can mix audio content differently for various playback systems and set playback levels, all at the postproduction stage, so broadcasters can deliver a more consistent audio signal and ensure that the most important audio elements come through.

Metadata provides a number of parameters that are specifically intended to change the sound of the program delivered to the consumers' unique listening environment. These metadata parameters are known as dialogue level (also known as dialogue normalization or dialnorm), dynamic range control, and downmixing. Although technically not an individual metadata parameter, downmixing within the consumer's decoder is effected by specific metadata parameters, and as with dialnorm and dynamic range control, care must be taken in monitoring and selecting the metadata parameters that effect downmixing conditions. The sound engineer on the production side is ultimately responsible for optimizing the multichannel mix for best reproduction in an optimal listening environment. However, care should also be taken to ensure that less optimal listening environments are accounted for as well. This is the reason why it is important that during transcoding metadata is not distorted or only distorted in a limited way, in order to preserve the quality of the metadata designed during the production stage.

The dialogue level parameter provides a normalization value to the home decoder. This value adjusts the volume of the audio to a preset level, which aids in level matching from program content to program content and media to media. Dialogue level does not assert any compression or expansion on the program material, but lowers the volume of the audio to a standardized level. Dialogue level works in partnership with dynamic range control profiles. The dialogue level parameter sets a sort of "null band" between the soft and loud portions of the program.

Dynamic range control (DRC) which is sometimes referred to as dynamic range compression or midnight mode gives the consumer the flexibility to listen to program audio with a reduced dynamic range. Compression of the dynamic range lets viewers watch television without disturbing the neighbors. This control is often optional and can be turned off in most audio decoders, such as the Dolby Digital decoder. Dynamic range control is also used for the common "midnight mode" feature on consumer decoders.

At lower volumes, the softer portions of a program (whispers and soft-spoken dialogue) are more difficult to hear. If the viewer increases the volume, however, the louder portions (explosions, onscreen arguments, gunshots, etc.) become too loud for comfortable listening. Alternatively, in an environment with a high level of background noise, quieter portions of the program will be drowned out by the ambient noise. When dynamic range profiles are asserted within the decoder, the decoder raises the level of the softer portions of the program while lowering the level of the louder portions, allowing the user to enjoy the movie without having to continually reach for the volume control.

Dynamic range control typically consists of two parameters or "profiles": RF mode and Line mode. It is to be noted that these two parameters do not change the content of the encoded audio within the bitstream. They are used to adjust the extremes of the program material within the listening environment to account for those instances where it is preferable or necessary to listen to the program at a reduced dynamic range.

RF mode is designed for peak limiting situations where the decoded program is intended for delivery through an RF input on a television, such as through the antenna output of a set-top box. It typically allows for a dynamic range compression in the range of ±48.16 dB and is also referred to as low-rate DRC.

Line mode provides a lighter type of compression, and also allows user adjustment of the low-level boost and high-level cut parameters within a home decoder. It typically allows for a dynamic range compression in the range of ±24.08 dB and is also referred to as high-rate DRC. The adjustment or "scaling" of the boost and cut areas allows the consumer to customize the audio reproduction for their specific listening environment.

Downmixing is a feature within audio encoders such as Dolby Digital that allows a multichannel program to be reproduced by fewer speaker channels. Simply put, downmixing allows consumers to enjoy a digital television broadcast without requiring a complete 5.1-channel home theater setup. As with stereo mixing, where the mix is monitored in mono on occasion to maintain compatibility, multichannel audio mixing requires the engineer to reference the mix with fewer speaker channels to assure compatibility for downmixing situations.

Certain metadata parameters assist in achieving an appropriate downmix, helping to ensure that the intention of the sound engineer/content producer will translate across these environments. Specifically, metadata provide control over how certain speaker channels are "folded" into the resulting downmix. While a sound engineer usually optimizes the multichannel mix for reproduction in an ideal listening environment, it is also important to preview the mix in downmixing conditions to ensure compatibility with different playback systems when selecting downmixing metadata parameters.

As outlined above, metadata can, among other things, be used to control a time-variable gain element in the decoder, using this as a dynamic range control and/or limiting means of an audio signal to prevent clipping. The point of applying compression on the decoder side, as opposed to compression on the encoder side, is that in this way, the end user retains control over the amount of dynamic range compression. For late-night viewing, the end user may want to use maximum compression, while "audiophiles" with their own home theater may prefer to enjoy the full dynamic range of the original theater mix.

In modern digital broadcasting chains, several audio formats are used in the production-, contribution- and transmission stages. Where the original audio mix may still be an uncompressed linear PCM format stream, the end result of production often is a Dolby E format stream. Using Dolby E as the audio codec in the content production process, a producer has the possibility to embed, amongst many others, metadata parameters describing overall program loudness (DialNorm), the compressor profile to be used to generate DRC coefficients, and the downmix.

FIG. 1 illustrates an exemplary chain 100 of audio transcoding from a production center to the consumer's home. At the production center 101 the audio stream is typically in an audio format best suited for production and post-processing purposes such as Dolby E. This production audio stream is then transcoded into a format best suited for emission purposes 102, such as Dolby Digital which is also referred to as Dolby D or AC-3. If transmission or broadcasting of the audio stream is required, then this emission audio stream may require transcoding into a suitable transmission or broadcasting format 103, such as HE-AAC. This transmission audio stream may then be transmitted over a network 104 to a plurality of set-top boxes 105 at consumers' homes. Due to the fact that most consumer equipments 106 require specific consumer audio formats, such as Dolby Digital, to render correctly the audio stream, a further transcoding from the transmission audio stream into a consumer audio stream is required in the set-top boxes 105. It should be noted that some of production, emission, transmission and consumer audio stream formats may be identical. Notably the emission and the consumer audio stream format may both be Dolby Digital.

In other words, the Dolby E format stream may be transcoded into an audio data stream which is more suited for rendering the content in a movie theatre, a home theatre or a traditional home stereo. An example for such an emission audio data stream is the Dolby Digital stream. This transcoding between audio data stream formats, i.e. the transcoding between a production audio stream and an emission audio stream, also triggers the need for metadata transcoding.

If transmission or broadcasting of the audio stream is required, the emission audio stream, e.g. the Dolby Digital stream, may require transcoding into a transmission audio stream, such as the MPEG HE-AAC audio stream which is optimized for the transmission of audio over low bit-rate links. Also for such transcoding between an emission audio stream and a transmission audio stream, the associated metadata needs to be transcoded.

After transmission, the audio data stream usually is decoded at a receiver which may be a set top box (STB) at a consumer's premise. Notably, if the audio data stream is a multichannel audio stream, such as a surround sound audio stream, it may be beneficial to transcode the transmission audio stream into a consumer audio stream, such as Dolby Digital. By means of this, the multichannel signal can be forwarded via an optical or coax S/P DIF link to a multichannel receiver in the consumers' home theatre or TV set. Also this transcoding between a transmission audio stream and a consumer audio stream requires transcoding between the associated metadata.

When the audio data stream of one format is transcoded into an audio data stream of another format, metadata needs to travel with it as well. The transcoding of DialNorm metadata typically does not present considerable problems since it usually changes significantly only at program boundaries and stays mostly constant otherwise. The transcoding of DRC metadata is, however, non-trivial since the DRC control signal has different framing in different audio formats. Table 1 lists different frame lengths of exemplary audio formats and codecs.

TABLE 1

| codec | video frame rate (fps) | frame length in samples |
|---|---|---|
| AAC | N/A | 128/1024 |
| HE AAC | N/A | 256/2048 |
| LD AAC | N/A | 120/960 |
| LD HE AAC | N/A | 240/1920 |
| Dolby D/AC-3 | N/A | 256/1536 |
| Dolby E | 25 | 1920 |
| Dolby E | 50 | 960 |
| Dolby E | 30 | 1600 |
| Dolby E | 60 | 800 |

For the AAC based formats, the left number in the "frame length" column refers to the length of short block/frame and the right number to the long block/frame resolution. For the Dolby Digital/AC-3 format, the left number in the "frame length" column refers to the resolution of high-rate DRC words, i.e. the frame size for the Line mode, and the right number to the resolution of low-rate DRC words, i.e. the frame size for the RF mode.

As can be seen, depending on the configuration, transcoding of DRC metadata may either go from metadata at a higher rate to a lower rate, or vice versa. To make matters more complicated, AAC based formats can change time resolution, i.e. frame length, on the fly, so that both situations, i.e. transcoding from higher rate to lower rate and transcoding from lower rate to higher rate, can happen in the same stream and during the same transcoding operation. Furthermore, AAC based formats can signal the presence or the absence of metadata on a frame-by-frame basis. Typically, the decode semantics define a sample-and-hold behavior, i.e. the decoder is instructed to always use the latest gain control signal received, until new data arrives. By consequence, the absence of metadata in an AAC frame indicates to the decoder that the latest gain control signal should be applied until further notice.

The gain applied by a compressor can be characterized by long quasi-stationary portions, interrupted by sharp "attacks" where the gain is lowered quickly. These "attacks" are typically applied to soften sudden increases in acoustic intensity, such as explosions in a movie. From these dips the compressor gain recovers with a long time constant, referred to as a "release". In other words, a sudden increase in acoustic intensity is countered by sharp gain "attacks", where the gain value is reduced strongly over a very short period of time, while gain increases are typically performed smoothly during a gain "release" period.

While some amount of modulation distortion of the audio signal is inevitable on the attack when applying the DRC gain, the decay time constant of such an attack is chosen such that modulation distortion is inaudible. The selection of an appropriate decay time for gain attacks is a crucial task of a sound engineer, when designing appropriate DRC metadata, and care must be taken during metadata transcoding to not destroy such properties when transcoding DRC metadata from a production audio format to an emission audio format and further into a transmission audio format, such as AAC.

Furthermore, a compressor may also be coupled with a limiter that limits the maximum compressor gain at any one time to never generate a signal that goes past 0 dBFS. Such limiters are typically used to prevent clipping. Also such limiter functionality needs to taken into account when transcoding metadata.

Audio codecs, such as AAC, HE AAC and Dolby Digital/AC-3, are typically adaptive transform-based codecs using a frequency-linear, critically sampled filterbank based on the Princen-Bradley time domain alias cancellation (TDAC) technique, such as the MDCT, i.e. the modified discrete cosine transform. The MDCT transform is often coupled with an additional window function in order to avoid discontinuities at the transform boundaries by making the MDCT and inverse MDCT function go smoothly to zero at the filter boundary points.

Figure 2:
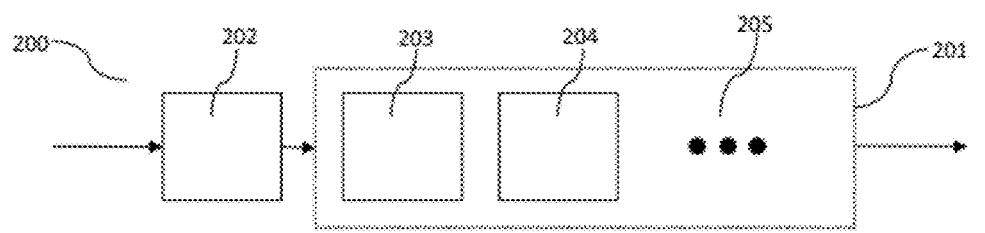
FIG. 2 illustrates a typical encoding and decoding structure of audio codecs.
Figure 2:
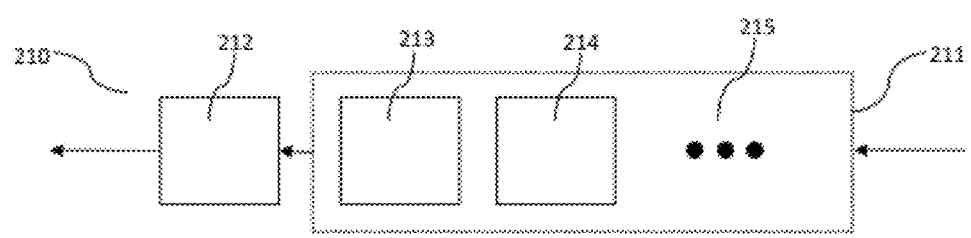

This is shown schematically in FIG. 2 where an audio encoder 200 and an audio decoder 210 are illustrated. FIG. 2 shows a transform-based encoder 201 and a transform-based decoder 211 as it is used in audio coding schemes such as AAC and Dolby Digital/AC-3. As outlined above, such coding schemes comprise TDAC transform filterbanks 204 on the encoding side and inverse TDAC transform filterbanks 214 on the decoding side. Furthermore, window functions 203 and 213, at the encoding and the decoding side respectively, remove discontinuities of the TDAC transforms 204, 214 at the filter boundaries. In addition, the transform-based encoder 201 and decoder 211 comprise additional components, such as transient detectors, quantization means, bit allocation means, etc., represented by the dots 205 and 215, respectively.

In order to further lower the transmission data rates, certain audio codecs, such as HE-AAC, use a technique referred to as spectral band replication (SBR). The underlying principle of SBR is the fact that the psychoacoustic importance of higher frequency portions of an audio signal is relatively low. Audio codecs using SBR, therefore, only encode the lower half of the signal spectrum using transform-based coders as described above. The higher half of the signal spectrum is generated by a SBR decoder or synthesis, which is mainly a post-process following the conventional transform-based decoder. Instead of transmitting the high frequency spectrum, SBR reconstructs the higher frequencies in the decoder based on an analysis of the lower frequencies transmitted in the underlying coder. To ensure an accurate reconstruction, some guidance information is transmitted in the encoded bit-stream at a very low data-rate. Such a SBR analysis using QMF (Quadrature Mirror Filter) analysis at the encoding side is illustrated in FIG. 2 as box 202. Typically, such a QMF analysis determines essential spectral signal information by analyzing e.g. 64 signal sub-bands. On the decoding side, signal information is used within a SBR synthesis 212 using a QMF synthesis filterbank comprising 64 sub-bands.

The primary advantage of transform-based coding schemes outlined above is that signal components and corresponding quantization noise components (intended to be masked) are kept within a critical bandwidth, deriving maximal benefit from the masking characteristics of the human ear, and minimizing the resulting data rate needed for perceptually noise-free coding.

Before turning to transcoding of DRC metadata, a short overview of the use of such DRC metadata at the audio decoder will be provided. For every frame or block, the audio decoder will parse the received bitstream that indicates whether a new gain value is transmitted for the particular frame. If no new gain values are provided, the decoder will use the last transmitted gain value. On the other hand, if a new gain value has been received, then this new gain value will be read in and applied.

Figure 3:
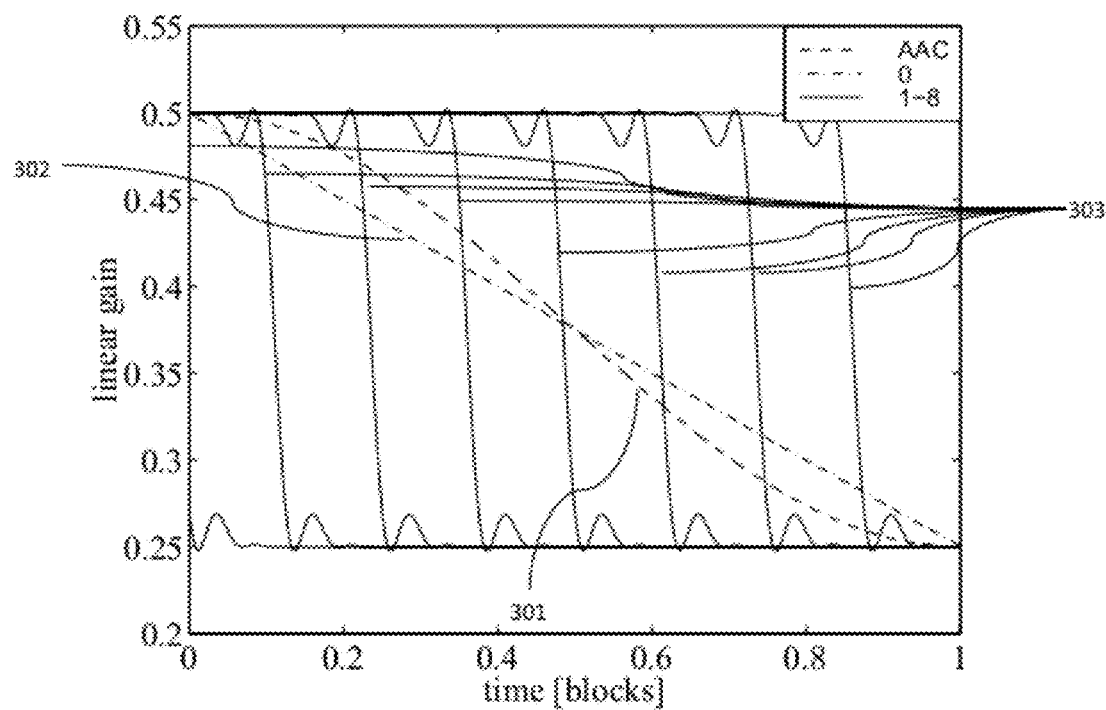
FIG. 3 illustrates different interpolation gain curves for different audio codecs.
Figure 4A:
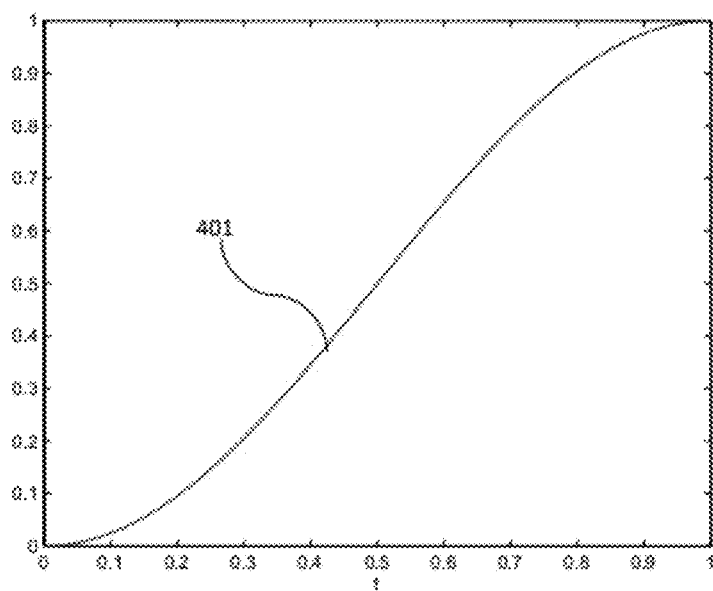
FIG. 4*a* illustrates an interpolation function of an audio codec.
Figure 4B:
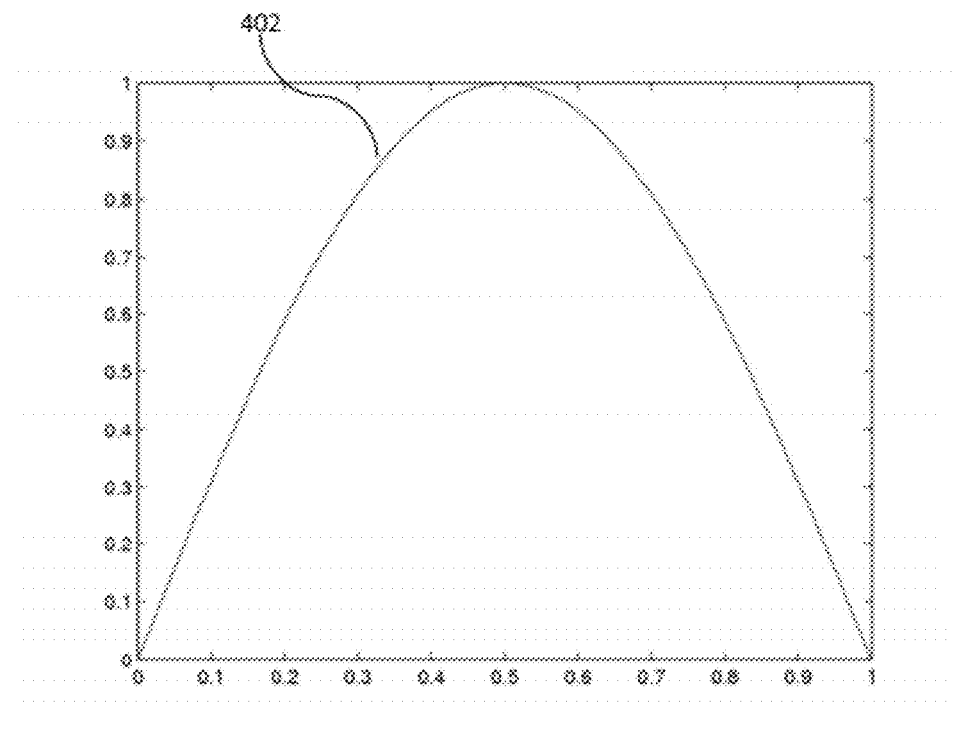
FIG. 4*b* illustrates the window function associated with the interpolation function of FIG. 4*a*.
Figure 4C:
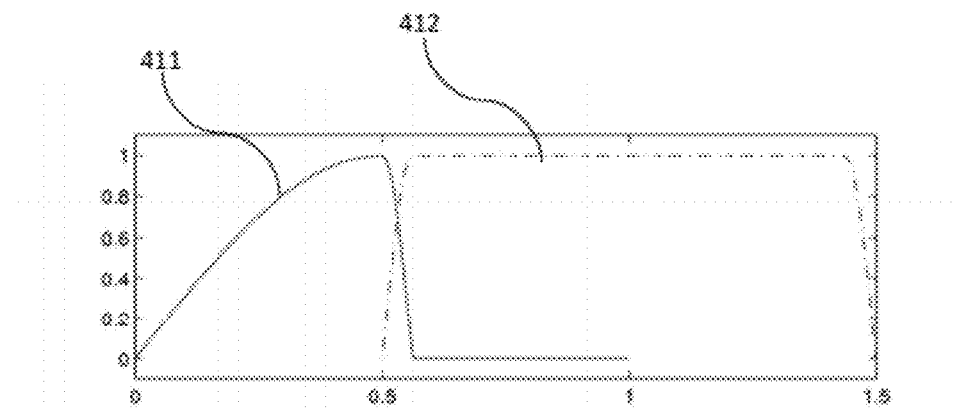
FIG. 4*c* illustrates an example for a non-symmetrical window function and its associated interpolation function.
Figure 4C:
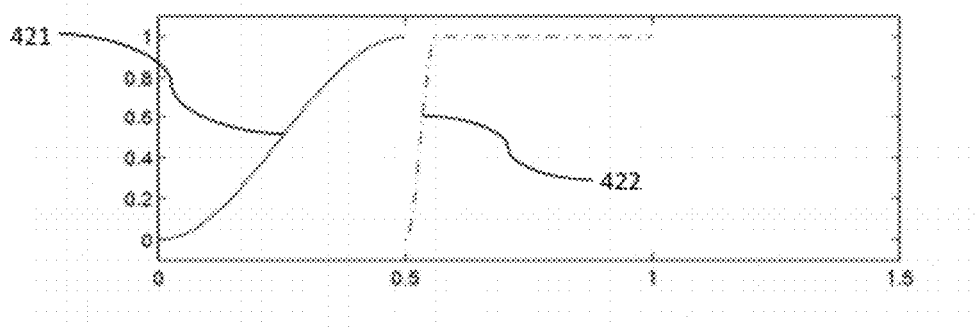

For a certain group of audio codecs, such as AAC and AC-3, a newly received gain value will be used to amplify or attenuate the spectral audio data which is decoded out of a frame. In other words, the gain is applied to the spectral audio sub-bands before application of the inverse TDAC transform. Due to the application of this transform and the sample overlap typically applied in relation with the transform and due to the associated windowing, the gain values will effectively be interpolated between successive frames. In this context, the interpolation function can be viewed as a weight function. Such an interpolated gain curve is illustrated in FIG. 3, where the S-shaped interpolation function 301 of an AAC codec is shown. A typical interpolation function is shown as graph 401 in FIG. 4*a*. The corresponding window function 402 is shown in FIG. 4*b*. In addition, it should be noted that also non-symmetrical window functions and associated interpolation functions may be used. Such non-symmetrical window functions may occur, e.g., when window functions are changed from one signal block to the next. In FIG. 4*c* such non-symmetric window functions 411 and 412 are illustrated, as well as their associated interpolation functions 421 and 422.

Figure 5:
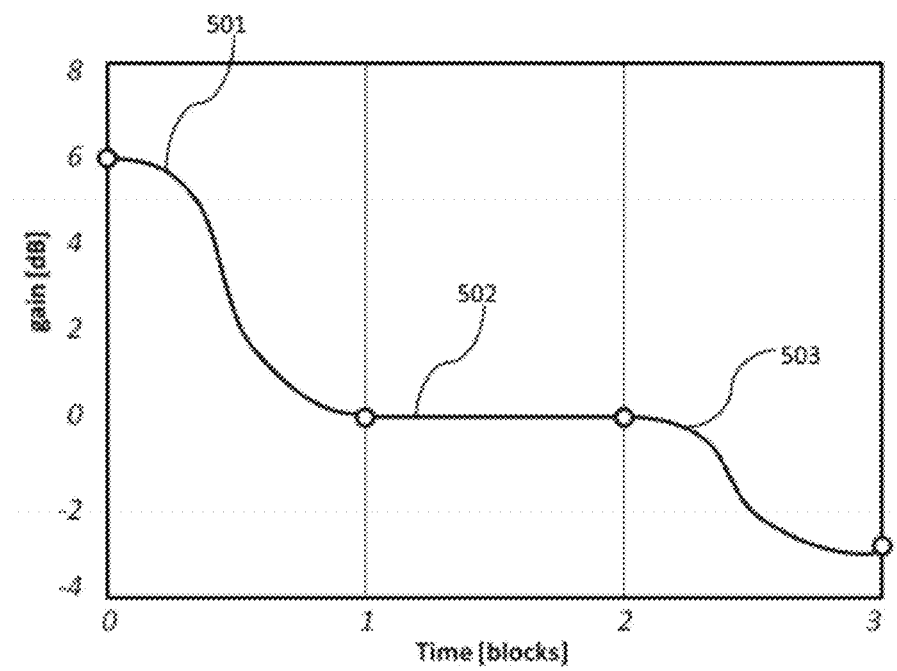
FIG. 5 illustrates a series of concatenated interpolated gain curves.

Furthermore, FIG. 5 shows the interpolated gain curve for three consecutive blocks or frames. As can be seen, the gain transition from 6 dB to 0 dB from the zero block to the first block is interpolated by the AAC window function which yields the typical S-shaped interpolation curve 501. From the first block to the second block, the gain value remains unchanged at 0 dB, so that the gain curve 502 stays flat. Then another gain transition occurs in the third block to −3.5 dB which again results in a typical S-shaped interpolation curve 502.

For another group of audio codecs, such as HE AAC codecs, the gain will not be applied on the MDCT spectrum. Instead, it will be applied before QMF (Quadrature Mirror Filter) synthesis, which typically follows the inverse MDCT transform. By default the gain values are interpolated linearly between adjacent frames or slots as shown in FIG. 3 as the interpolation curve 302. In addition, the HE AAC bitstream syntax reserves 3 more bits to choose one of 8 different interpolation curves 303. These schemes essentially do not interpolate, but hold the old gain value for different amounts of time before "abruptly" jumping to the new gain following a predefined transition curve. FIG. 3 shows a set of transition curves 303 distributed across the frame width. Such abrupt gain transition curves better match situations when sudden gain changes are desired, such as gain attacks. Also for the HE AAC encoding scheme, the series of gain values is effectively interpolated to form the gain curves 302 and 303 as shown in FIG. 3. This interpolation is related to the impulse response of the QMF synthesis.

For ease of exposition, it can be assumed that a gain control signal, which will also be referred to as a gain curve, has an infinitely high resolution whereas in reality the gain values are only sampled on a discrete grid. To go from one representation to the other, an interpolation stage that interpolates the sampled gain values to one which is time continuous may be assumed. This stage typically obeys the sample-and-hold semantics of the decoder laid out above. Instead of carrying gain control coefficients for every frame, some audio data formats, such as Dolby E, allow for the signaling of selected metadata profiles and in particular compressor profiles. For transcoding purposes, such compressor profiles can be viewed as gain control signals. As a matter of fact, compressor profiles implicitly assign a particular gain value to every audio signal sample. Consequently, the compressor profile actually defines a gain control signal. Using an interpolation stage, also these gain control signals have a time continuous signal representation.

In the following, the problem of transcoding metadata will be further analyzed. In this context, reference is made to W. Schildbach et al., "Transcoding of dynamic range control coefficients and other Metadata into MPEG-4 HE AAC", Audio Engineering Society, 123. Convention, Oct. 5-8, 2007, New York, N.Y., which is incorporated by reference.

As has already been mentioned, the goal of transcoding is that the audio signal which is subjected to the transcoded metadata, and in particular to the transcoded gain values, sounds the same or as similar as possible to the audio signal with the original gain applied. From this stipulated goal a certain number of constraints on the transcoding algorithms can be formulated:

Where the signal submitted to the original gain values did not clip, the signal submitted to the transcoded gain values should also not clip either. That is, the signal must preserve clipping protection. This can be achieved by picking gain samples such that the gain applied on the transcoded signal never exceeds the incoming gain.

For a static gain curve, the transcoded gain curve should be the same. That is, there should be no mismatch for quasi static signals between the original gain curve and the transcoded gain curve.

When dynamic gain changes occur, the gain that is applied on the transcoded signal should mimic the incoming gain as closely as possible, i.e. the release and attack times should be similar.

Taking into account these constraints, a certain number of transcoding algorithms can be formulated. These transcoding algorithms will be outlined in the following. The gain values of the initial audio coding format will be referred to as the source gain values and the corresponding audio coding format will be referred to as the source format of the source coding scheme. The transcoded gain values will be referred to as the target gain values and the associated audio coding format as the target format of the target coding scheme.

It should be noted that depending on the particular transcoding situation, different emphasis may be put on different sets or subsets of constraints. In certain situations, it may be beneficial to ensure that the target gain curve is always smaller or equal to the source gain curve. If clipping of the audio signal on the target side is to be avoided, this may be a preferred option. On the other hand, it may also be sufficient to ensure that only at a certain set of sample points the target gain curve is smaller or equal to the source gain curve. By way of example, it may be sufficient to stipulate that only the target gain values are smaller or equal to the source gain values. In such cases, it may occur that, due to the interpolation at the source side and/or at the target side, the target gain curve exceeds the source gain curve at certain points. This, however, may yield a better overall matching of the source gain curve and the target gain curve at the expense of possibly tolerable overmodulation effects. Furthermore, it may be appropriate in some transcoding situations to further weaken the constraints with regards to the target gain curve or the target gain values being smaller or equal to the source gain curve or the source gain values. In such cases, stronger emphasis may be put on the overall matching of the gain curves.

It should also be noted that the following algorithms can be used to progressively transcode the gain metadata from a source coding scheme to a target coding scheme. This is important due to the real-time characteristics of the encoded audio signals. Therefore, it is not possible in typical transcoding scenarios to buffer an arbitrary number of source coding blocks and to perform an overall transcoding operation on these buffered source coding blocks. Consequently, appropriate transcoding algorithms need to perform progressive transcoding on a block per block basis. Such a progressive blockwise transcoding may be achieved with the following transcoding algorithms.

Furthermore, it should be noted that the following algorithms are applicable to non commensurate framings. This means that the framing of the source coding scheme and the framing of the target coding scheme may be arbitrarily different, both with regards to the frame size, i.e. the number of samples per frame or the length of audio signal contained per frame, and with regards to the synchronization of the frames, i.e. their respective start and finish times. As a matter of fact, even the sampling rates of the source coding scheme and the target coding scheme may differ.

Furthermore, it can be stated that the following algorithms are not only limited to the transcoding of audio gain data, but could also be applied to any device that transcodes a signal from one compressed bitstream format to another in which the framing of the formats are not compatible. Some examples with regards to audio coding are Dolby E to/from HE-AAC transcoders or Dolby Digital to/from HE-AAC transcoders. By way of example, even though a Dolby Digital bitstream allocates space for metadata, due to the fact that the AAC/HE-AAC and Dolby Digital bitstreams have different framing, it is not possible to directly map the metadata from the AAC/HE-AAC bitstream to the Dolby Digital bitstream. Therefore, in order to preserve the metadata carried in the AAC/HE-AAC bitstream, methods and algorithms as the ones described in the following are required for performing metadata translation.

Algorithm 1: Rank-Order Filter

One possibility to meet or to approximate the above mentioned constraints is to apply a rank-order filter to the source gain values. Let $g'_i$, $i=0, \ldots, N-1$, be the target gain values for N frames of the target format and $g_j$, $j=1, \ldots, M-1$, the source gain values for M frames of the source format. Furthermore, let $t'_i$ be the times when the associated target gain values $g'_i$ are to be applied and $t_j$ be the times when the source gain values $g_j$ are to be applied.

Due to the interpolation function of the filterbanks and/or window functions employed in the decoder of the source format, the source gain values $g_j$ define a continuous source gain curve, referred to as G(t), which consists of a concatenation of curve segments $G_j(t)$ between two adjacent source gain values $g_j$ and $g_{j+1}$. If W(t) is the interpolation or weight function between two source gain values, the curve segment $G_j(t)$ can be written as $$G_j(t) = g_j(1-W(t-t_j)) + g_{j+1}W(t-t_j). \quad (1)$$

Figure 6:
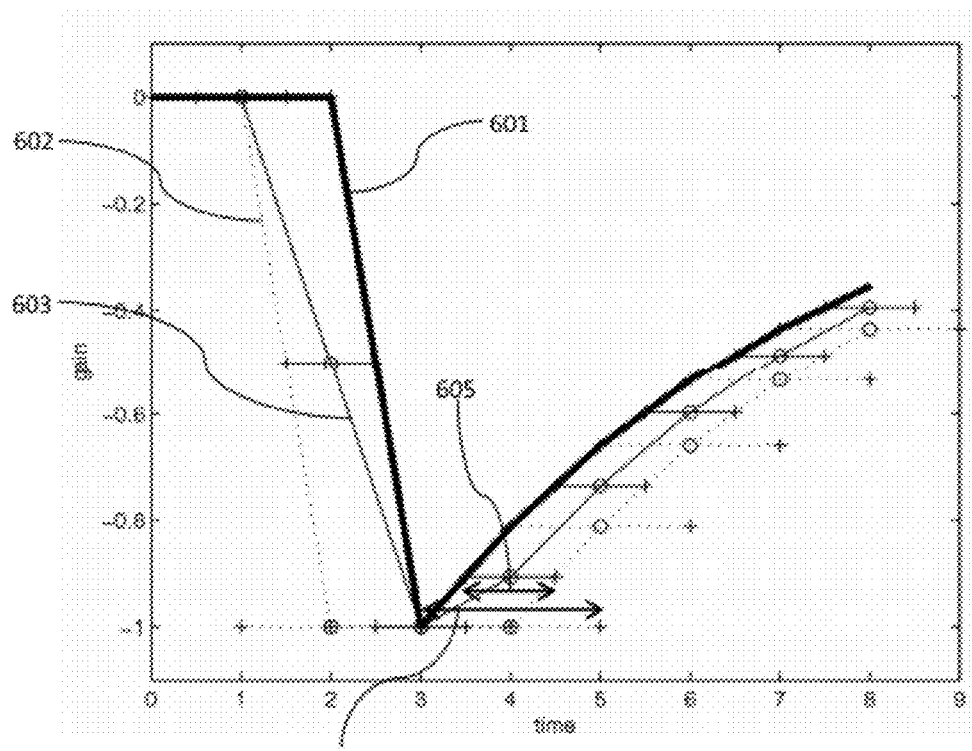
FIG. 6 shows a first example to illustrate the gain matching properties of a first transcoding algorithm.

FIG. 6 illustrates such an interpolated source gain curve G(t), 601, which consists of a concatenation of curve segments $G_j(t)$, with $j=0, \ldots, 7$. In other words, the source gain curve G(t), 601 is based on nine source gain values $g_j$, $j=0, \ldots, 8$ at times $t_j$, $j=0, \ldots, 8$. In the illustrated example the underlying source coding scheme is HE AAC for which the linear interpolation method has been selected. This linear interpolation method explains the linear transition between adjacent source gain values $g_j$. It should be noted that other coding schemes provide similar interpolated source gain curves.

It can be demonstrated that when selecting the target gain values $g'_i$ at the time $t'_i$ using the formula $$g'_i = \min\{g_j | |t'_i - t_j| \leq \beta\}, \quad (2)$$

then the above mentioned transcoding constraints can be met under certain ancillary conditions. In general, it can be stated that if $\beta$ is selected such that $$\beta \geq \max\{(t'_{i+1}-t'_i),(t_{j+1}-t_j)\} \quad (3)$$

then the interpolated target gain curve will always stay below the interpolated source gain curve. In particular, this applies when the underlying coding schemes use linear interpolation schemes.

Figure 7A:
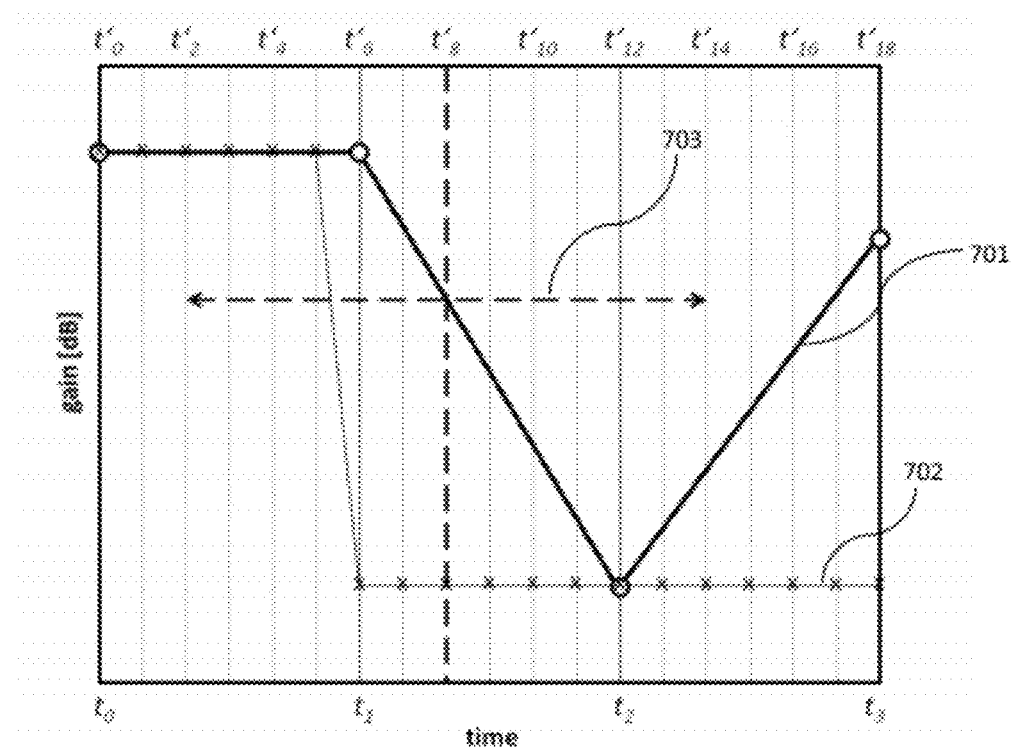
FIGS. 7*a* and 7*b* show a second example to illustrate the gain matching properties of a first transcoding algorithm.
Figure 7B:
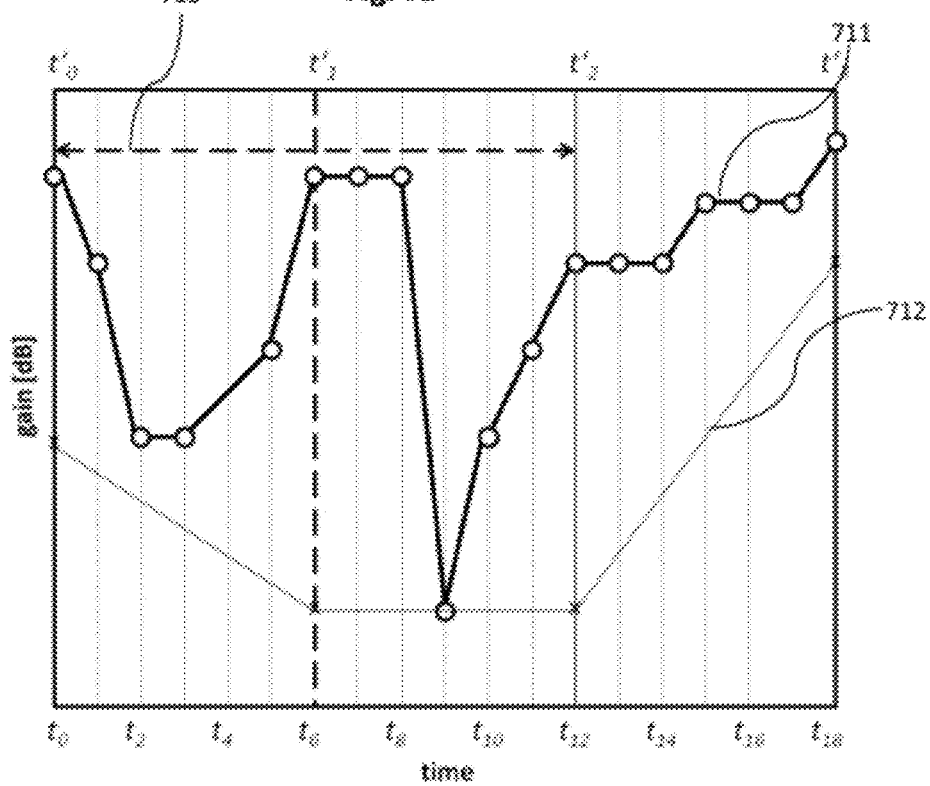

This is shown schematically in FIGS. 7a and 7b. FIG. 7a illustrates the case where $(t'_{i+1}-t'_i) \leq (t_{j+1}-t_j)$, i.e. where the frame size of the target coding format is smaller or equal to the frame size of the source coding format. By way of example, such situations may occur when transcoding metadata from HE AAC long frame resolution to Dolby Digital. The source gain curve 701 is defined by the source gain values $g_j$ at time instances $t_0$, $t_1$, $t_2$ and $t_3$ represented by the circles. For simplicity reasons, a linear interpolation as known from HE AAC has been applied. As can be seen from FIG. 7a, if $\beta$ is chosen to be greater or equal to $(t_{j+1}-t_j)$, a series of target gain values $g'_i$ at time instances $t'_0$ up to $t'_{18}$ can be determined using formula (2). These target gain values $g'_i$ are represented as crosses in FIG. 7a and yield the target gain curve 702, which is always below the source gain curve 701. The mode of operation of the formula for $g'_i$ can be seen with the double arrow 703 which indicates a time interval around the time instance $t'_8$ which extends $(t_{j+1}-t_j)$ time instances backward and forward. In other words, $\beta$ equals $(t_{j+1}-t_j)$. Within this time interval the minimum source gain value $g_j$, with $$t_j \in [t'_i - |t_{j+1}-t_j|, t'_i + |t_{j+1}-t_j|], \quad (4)$$

is chosen as the target gain value $g'_i$. At the time instance $t'_8$ the target gain value $g'_8$ is determined to be the source gain value $g_2$ at time instance $t_2$.

FIG. 7b illustrates the case where $(t'_{i+1}-t'_i) \geq (t_{j+1}-t_j)$, i.e. where the frame size of the target coding format is greater or equal to the frame size of the source coding format. By way of example, this situation may occur when transcoding Dolby Digital to HE AAC long frame resolution. The source gain values $g_j$ at time instances $t_0$ up to $t_{18}$ are represented by circles and result in a source gain curve G(t), 711. When selecting $\beta$ to be greater or equal to $(t'_{i+1}-t'_i)$ a series of target gain values $g'_i$ at time instances $t'_0$ up to $t'_3$ can be determined using formula (2). These target gain values are represented as crosses in FIG. 7b. As can be seen, these target gain values $g'_i$ result in a target gain curve 712 which is always below the source gain curve G(t), 711. Similar to FIG. 7a, the double arrow 713 indicates the time interval around time instance $t'_1$ for $\beta=(t'_{i+1}-t'_i)$.

Attention is now drawn to FIG. 6 where a transcoding example is illustrated for the case where $(t'_{i+1}-t'_i)=(t_{j+1}-t_j)$. It can be seen that, if $\beta=(t'_{i+1}-t'_i)$ the dotted line target gain curve 602 is obtained. Furthermore an associated time interval around time instance t'=4 is illustrated by the double arrow 604. It should be noted that the compressor release of the target gain curve is delayed compared to the compressor release of the source gain curve 601. Precisely, the compressor release of the source gain curve starts at time instance t=3, whereas the compressor release of the target gain curve starts only at time instance t'=4. On the other hand, it can also be seen that the attack of the target gain curve is advanced compared to the attack of the source gain curve. Precisely, the compressor attack of the source gain curve starts at time instance t=2, whereas the compressor attack of the target gain curve starts already at time instance t'=1.

FIG. 6 also shows a second target gain curve 603 which has been obtained by selecting parameter $\beta=0.5*(t'_{i+1}-t'_i)$, i.e. a parameter value which is below the limit stipulated in formula (3). When choosing a parameter $\beta$ with $$\beta < \max\{(t'_{i+1}-t'_i),(t_{j+1}-t_j)\}, \quad (5)$$

it cannot be assured anymore that target gain curves are always below source gain curves. However, the variation of the parameter $\beta$ gives control over the amount of delay of the compressor release and/or of the amount of advance of the compressor attack. The target gain curve 603 in FIG. 6 shows that, when selecting $\beta=0.5*(t'_{i+1}-t'_i)$ the compressor attack and release curve can be moved closer to the source gain curve 601 than the target gain curve 602. The size of the relevant time interval for determining the target gain values is shown as the double arrow 605 at time instance t'=4. However, it should be noted that parameters $\beta$ with $\beta<\max\{(t'_{i+1}-t'_i),(t_{j+1}-t_j)\}$ should be picked with care because too low values of $\beta$ can lead to target gains that significantly exceed the source gain curve. Such excessive gain overshoots may lead to audible audio defects such as clipping. The choice of an appropriate parameter $\beta$ is therefore a compromise made by a designer of a metadata transcoder made under consideration of a plurality of different aspects. By way of example, such aspects may comprise the applied audio coding formats, the encoded contents, the direction of transcoding from a source encoding scheme to a target encoding scheme, and others.

It should be noted that this algorithm can be implemented with low computational complexity, notably if the metadata associated with the different time instances $t_j$ come in a pre-ordered manner. This is due to the fact that the number of source gain values $g_j$ used for the computation of the target gain values $g'_i$ is low. Typically, only very few of comparative operations for determining the minimum value are needed. Furthermore, it should be noted that the proposed rank-order filter algorithm only makes use of the source gain values $g_j$ and their associated time instances $t_{j,i}$ n order to determine the target gain values $g'_i$. This data is readily available directly from the metadata bitstream at the transcoding unit and does not require any additional processing. This property adds to the low computational complexity of the proposed rank-order filter algorithm.

Figure 8:
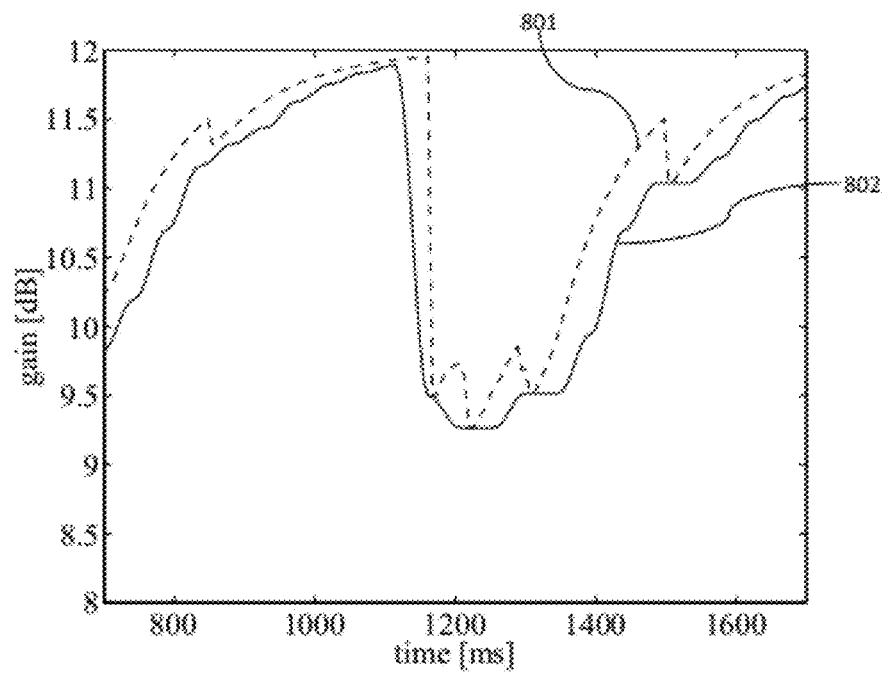
FIG. 8 shows experimental results for the transcoding of gain metadata using the first transcoding algorithm.

FIG. 8 illustrates a further example of transcoding a source gain curve 801 using the rank-order filter algorithm described above. In the illustrated example, the frame size of the source coding format is 256 samples, whereas the frame size of the target coding format is 2048 samples. The parameter $\beta$ has been selected to be $\beta=\max\{(t'_{i+1}-t'_i),(t_{j+1}-t_j)\}$. Such transcoding situation may occur, when a coding scheme such as Dolby Digital is transcoded into HE AAC, which has the possibility to define relatively long frame sizes, in order to provide for lower bandwidth transmission. FIG. 8 also shows the transcoded target gain curve 802 and it can be seen that in line with the stipulated condition on parameter $\beta$, the transcoded gain curve 802 is below the source gain curve 801. Furthermore it can be observed that attacks have been advanced, while compressor releases have been delayed. By selecting parameter $\beta$ with $\beta<\max\{(t'_{i+1}-t'_i),(t_{j+1}-t_j)\}$ this effect may be reduced. This is, however, at the expense of a possible overshoot of the target gain curve compared to the source gain curve.

Furthermore, it should be noted that when selecting $\beta<\max\{(t'_{i+1}-t'_i),(t_{j+1}-t_j)\}$, it may occur, notably in the case where $(t'_{i+1}-t'_i)\leq(t_{j+1}-t_j)$, i.e. where the frame size of the target coding format is smaller or equal to the frame size of the source coding format, that no source gain value $g_j$ can be identified in the interval $[t'_i-\beta,t'_i+\beta]$ around time instance $t'_i$. In such instances, the formula $g'_i=\min\{g_j\|t'_i-t_j\|\leq\beta\}$ would not be able to yield a value for the target gain value $g'_i$. It may therefore be beneficial to make use of the sample-and-hold behavior of the decoder and assume the target gain values $g'_i$ to remain unchanged until a new value target gain value has been identified using the above mentioned formula (2). In other words, the target gain value formula can be written as $$g'_i = \begin{cases} \min\{g_j \mid |t'_i - t_j| \leq \beta\}, t_j \in [t'_i - \beta, t'_i + \beta] \\ g'_{i-1}, t_i \notin [t'_i - \beta, t'_i + \beta] \end{cases} \quad (6)$$

Alternatively, one may also make use of the sample-and-hold behavior of the decoder on the source coding scheme. This means that if no updated source gain value $g_j$ can be identified in the interval $[t'_i-\beta,t'_i+\beta]$ around time instance $t'_i$, then the last detected source gain value is assumed to be the current source gain value $g_j$. The formula for determining a target gain value $g'_i$ can then be rewritten as $$g'_i = \begin{cases} \min\{g_j \mid |t'_i - t_j| \leq \beta\}, t_j \in [t'_i - \beta, t'_i + \beta] \\ g_j, j \mid (t_j \leq t'_i) \wedge \min(t'_i - t_j), t_j \notin [t'_i - \beta, t'_i + \beta] \end{cases} \quad (7)$$

The advantage of both "sample-and-hold" approaches is that the target gain values $g'_i$ are determined solely based on the source gain values $g_j$. As outlined above, this property of the rank-order filter algorithm contributes to its low computational complexity.

Alternatively, it may be beneficial to furthermore take into account the exact course of the source gain curve G(t) and to determine the target gain values $g'_i$ using the modified formula $$g'_i = \min\{G(t)\||t'_i-t|\leq\beta\}. \quad (8)$$

This may be particularly beneficial in cases where $(t'_{i+1}-t'_i)\leq(t_{j+1}-t_j)$, i.e. where the frame size of the target coding format is smaller or equal to the frame size of the source coding format, as the set of appropriate source gain values to select a target gain value $g'_i$ would never be empty. The associated algorithm will be referred to as the generalized rank-order filter algorithm.

On the other hand, it should be noted that this modified selection formula requires the knowledge of the source gain curve at the metadata transcoder. In particular, the metadata transcoder needs to have knowledge of the interpolation function W(t) or possibly even the set of interpolation functions used by the source coding scheme. Based on these interpolation functions W(t) and the source gain values $g_j$, the source gain curve segments $G_j(t)$ and thereby the source gain curve G(t) may be determined. Overall, it is to be expected that by using the modified selection formula the computation complexity of the transcoding algorithm would be increased, compared to the version of the rank-order filter algorithm which only uses the source gain values $g_j$.

It should also be noted that the above mentioned formula (8) could be modified by only considering a set of samples of the source gain curve G(t). By way of example, it may be beneficial to only consider the values of the source gain curve at the time instances $t'_i$ of the target gain values and/or at the time instances $t_j$ of the source gain values. The formula could then be rewritten as $$g'_i=\min\{G(t)\||t'_i-t|\leq\beta\}, \text{ with } t \in \{t'_i,t_j\}. \quad (9)$$

Limiting the source gain curve G(t) to a set of sample values could reduce the computational complexity of the generalized rank-order filter algorithm. Furthermore, it should be noted that a segment of the source gain curve G(t) can be described by two adjacent source gain values $g_j$, $g_{j+1}$ and an interpolating weight function W(t). Consequently, if only a set of samples of the source gain curve G(t) are required, then this complete set of samples may be determined from the source gain values $g_j$ and a limited set of samples of the interpolation function W(t). This limited set of samples of the interpolation function W(t) may for example be stored in the memory of a metadata transcoder.

One could also contemplate to use a combination of both selection formulas, i.e. a combination of the rank-order filter algorithm and the generalized rank-order filter algorithm. By way of example, it may be beneficial to use the low complexity rank-order filter algorithm which uses only the source gain values $g_j$ for situation where the target block size is larger or equal to the source block size, while the higher complexity generalized rank-order filter algorithm which uses the source gain curve G(t), or a set of its samples, is used for situations where the target block size is smaller to the source block size.

Algorithm 2: "Best-Match" Gains

In order to determine a second algorithm which meets or at least approximates the above mentioned constraints for transcoding, the source gain curve G(t) and the target gain curve G'(t) will be compared. Let W'(t) be the interpolation function of the target decoding scheme. By way of example, the interpolation function for the AAC codec can be written as $W'(t)=(\sin(t\pi/2))^2$ in units of half the window size. This interpolation or weight function typically is the square of the window function. It should be noted that some codecs also foresee the possibility of window switching so that the interpolation function W'(t) may change from one coding block to another. Furthermore, the block size of the codec may change, which also results in a change of window function. These effects and circumstances may be taken into account by selecting the appropriate interpolation function W'(t) for each gain curve segment.

Using the interpolation function W'(t) of the target decoding scheme, the interpolated target gain curve G'(t) between two target gain values $g'_i$ and $g'_{i+1}$ can be written as $$G'_i(t)=g'_i(1-W'(t-t'_i))+g'_{i+1}W'(t-t'_i). \quad (10)$$

The overall target gain curve G'(t) can be obtained by concatenating adjacent target gain curve segments $G'_i(t)$.

Let $g_{j,i}$ denote all source gains at times $t_{j,i}$ with $t'_i < t_{j,i} \leq t'_{i+1}$, i.e. the group of source gain values within the time interval between two consecutive target gain values $g'_i$ and $g'_{i+1}$. It should be noted that, due to "on the fly" changes of frame sizes both on the source encoding scheme and on the target encoding scheme, the group of source gain values within the time interval and also the length of the time interval itself, may change on an ad hoc basis. Consequently, also the possible combinations of i and j in $t_{j,i}$ may vary on a block per block basis.

The condition to select target gain values $g'_i$ and more precisely target gain curve segments $G'_i(t)$ that are smaller or equal to the series of source gain values $g_{j,i}$ within the time interval $[t'_i, t'_{i+1}]$ can be written as $$G'_i(t_{j,i}) \leq g_{j,i}. \quad (11)$$

In other words, the target gain curve G'(t) at the time instances $t_{j,i}$ needs to be smaller or equal to the source gain values at the time instances $t_{j,i}$.

Defining the interpolation function of the target decoding scheme at the time instance $(t_{j,i}-t'_i)$ to take on the value $W'_{j,i}=W'(t_{j,i}-t'_i)$ and taking into account the formula for the target gain curve segment $G'_i(t)$, the condition can be written $$g'_i(1-W'_{j,i})+g'_{i+1}W'_{j,i} \leq g_{j,i},$$

which can be reformulated as $$g'_{i+1} \leq \frac{1}{W'_{j,i}} g_{j,i} - \frac{1-W'_{j,i}}{W'_{j,i}} g'_i.$$

This coupled set of inequalities needs to be valid for all target gain values $g'_i$, $\forall i$. Furthermore, all the target gain values $g'_i$ need to be greater or equal to zero, i.e. $g'_i \geq 0$, $\forall i$. For a normalized interpolation function, i.e. for a interpolation function with $|W'(t)| \leq 1$, this also leads to the observation that $$\frac{1-W'_{j,i}}{W'_{j,i}} g'_i \geq 0,$$

and consequently, the inequalities can be rewritten as $$0 \leq g'_{i+1} \leq \frac{1}{W'_{j,i}} g_{j,i} - \frac{1-W'_{j,i}}{W'_{j,i}} g'_i \leq \frac{1}{W'_{j,i}} g_{j,i}. \quad (12)$$

In a similar fashion the inequality for the adjacent target gain curve segment $G'_{i+1}(t)$ which follows the target gain curve segment $G'_i(t)$ can be written:

$$G'_{i+1}(t)=g'_{i+1}(1-W'_{j,i+1})+g'_{i+2}W'_{j,i+1} \leq g_{j,i+1}, \quad (13)$$

wherein $W'_{j,i+1}=W'(t_{j,i+1}-t'_{i+1})$ with $t'_{i+1}<t_{i,j+1} \leq t'_{i+2}$. This inequality provides another condition for $g'_{i+1}$, namely $$g'_{i+1} \leq \frac{1}{(1-W'_{j,i+1})} g_{j,i+1} - \frac{W'_{j,i+1}}{(1-W'_{j,i+1})} g'_{i+2} \leq \frac{1}{(1-W'_{j,i+1})} g_{j,i+1}, \quad (14)$$

due to the fact that $g'_i \geq 0$, $\forall i$ and that the interpolation function W'(t) is normalized, i.e. $W'_{j,i} \leq 1$, $\forall i, j$. As already mentioned above, the possible combinations of i and j are given by the current relationship between the block size of the source coding scheme and the block size of the target coding scheme. These possible combinations may evolve and differ on a block per block basis.

Setting $g'_0=0$, the remaining $g'_i$, i>0 can be selected from the range provided by the set of inequalities.

Figure 9A:
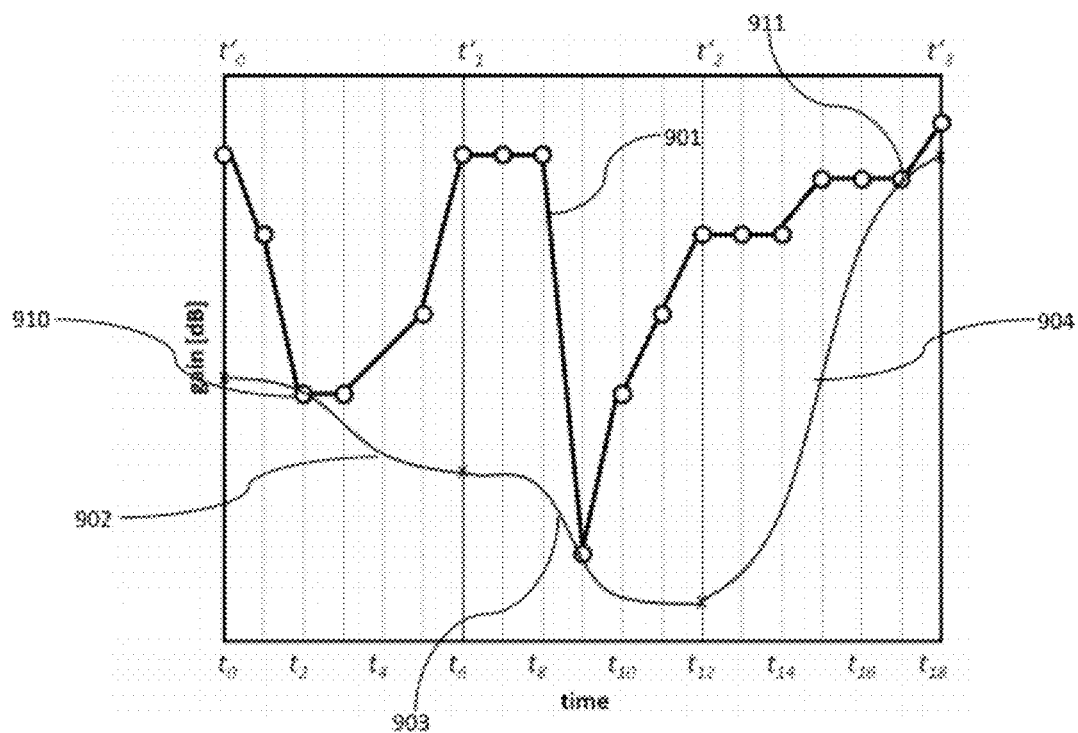
FIGS. 9*a* and 9*b* illustrate the gain matching properties of a second transcoding algorithm.

The process of selection is illustrated in FIG. 9a for the example that the time intervals of the target coding scheme $[t'_i, t'_{i+1}]$ are larger or equal to the time intervals of the source coding scheme $[t_j, t_{j+1}]$. FIG. 9a shows the source gain curve 901 which is obtained by the interpolation of the source gain values $g_0$ up to $g_{18}$ at time instances $t_0$ up to $t_{18}$, respectively. For this source gain curve 901 a transcoded target gain curve G'(t) is to be determined. In the illustrated example, this target gain curve comprises three target gain curve segments $G'_0(t)$, $G'_1(t)$ and $G'_2(t)$ shown as graph segments 902, 903 and 904, respectively, in FIG. 9. The condition that within the time interval $[t'_i, t'_{i+1}]$ $G'_i(t_{j,i}) \leq g_{j,i}$, can be written for the illustrated example as $$G_0(t_0) \leq g_0, G'_0(t_1) \leq g_1, G'_0(t_2) \leq g_2, G'_0(t_3) \leq g_3, G'_0(t_4) \leq g_4,$$
$$G'_0(t_5) \leq g_5, G'_0(t_6) \leq g_6$$

for $G'_0(t)$ and in a similar manner for $G'_1(t)$ and $G'_2(t)$. When using the interpolation function of the target decoder W'(t) the values $W'_{j,0}=W'(t_{j,0}-t'_0)$ for j=0, ..., 6 can be calculated. By using these interpolation values in the equations provided above, a set of inequalities for the target gain value $g'_1$ as a function of the previously selected target gain value $g'_0$ can be obtained. A preferred way to match the target gain curve segment $G'_0(t)$, i.e. the graph 902, to the source gain curve 901 in the interval $[t'_0, t'_1]$ is to select the maximum target gain value $g'_1$ for which all inequalities are met concurrently.

It should be noted that the target gain values $g'_i$ need to be picked with care from the range allowed by the derived inequalities. If a local optimum for a target gain value $g'_i$ is selected, then the inequalities above may significantly restrict the choice for possible values for the following target gain value $g'_{i+1}$. This may eventually lead to an oscillatory target gain curve $G'(t)$ which is typically not desirable. One example for such an oscillatory behavior may be seen, when selecting $g'_0=0$, which will leave large degrees of freedom for selecting an optimal and maximum value for $g'_1$ according to the above mentioned formulas (12) and (14). This, however, may require the selection of $g'_2$ small or even zero, due to the large corrective part $$\frac{1 - W'_{j,1}}{W'_{j,1}} g'_1.$$

In a next step, the next target gain value $g'_3$ can be freely maximized according to the set of inequalities. As can be seen, such a localized optimization and selection process, dealing with only one target gain value $g'_i$ at a time, may lead to undesirable oscillations in the target gain curve $G'(t)$.

Consequently, it may be beneficial to select target gain values within a more global optimization process without locally over-fitting to the data. By way of example, oscillations may be avoided by submitting the target gain values $g'_i$ to additional constraints, such as by limiting the target gain values to be greater than or equal to the target gain values $g'_i$ determined according to the rank-order filter algorithm outlined above. These conditions would then be met in addition to the inequalities outlined in the context with the best-match gain algorithm.

Furthermore, it should be noted that in case of target time intervals $[t'_i, t'_{i+1}]$ for which no source gain value $g_{j,i}$ exists with $t'_i < t_{j,i} \leq t'_{i+1}$, the above algorithm would not provide an inequality $G'_i(t_{j,i}) \leq g_{j,i}$. Consequently, no condition would exist to limit the selection of the corresponding target gain value $g'_i$. Such situations may occur when the block/frame size of the target coding scheme is smaller than the block size of the source coding scheme. This problem may be overcome e.g. by applying the sample-and-hold behavior of the audio decoder. By way of example, in such cases $g_{j,i}$ may be chosen to be the last known source gain value $g_j$.

Alternatively, it may also be beneficial in such cases, where the "best-match" gain algorithm does not provide any condition, to select the target gain value $g'_i$ in accordance to the rank-order filter algorithm outlined above. Furthermore, in another embodiment, it may also be beneficial to select possible source gain values $g_j$ from the interval $[t'_i - \beta, t'_i + \beta]$, wherein the parameter $\beta$ may be selected according to the formulas outlined in the context of the rank-order filter algorithm. Using these possible source gain values $g_j$, the inequalities according to the outlined "best-match" gain algorithm may be formulated and consequently, appropriate target gain values may be determined.

The described "best match" gains algorithm selects the appropriate target gain values $g'_i$ based on the source gain values $g_j$. In addition, it takes into account the course of the target gain curve $G'(t)$, which results from the interpolation of the target gain values $g'_i$ with the interpolation function $W'(t)$ according to the formula indicated above. Such a metadata transcoder does not need to be aware of the interpolation schemes used in the source coding scheme and purely relies on the source gain values which are readily available within the metadata bitstream. Consequently, the "best match" gains algorithm can be implemented with low computational complexity. Furthermore, it should be noted that the metadata transcoder does not need to have exact knowledge of the interpolation function $W'(t)$ of the target coding scheme. As a matter of fact, only particular samples $W'_{j,i}$ of this interpolation function need to be known to the metadata transcoder. These samples could be stored as a table in the memory of the metadata transcoder.

It should also be noted that similar to the rank-order filter algorithm, the "best match" gain algorithm can be generalized, so that not only the source gain values, but also the source gain curve are considered for transcoding purposes. The "best match" gain algorithm postulates that at the time instances of the source gain values, the target gain curve should be smaller or equal to the source gain values, i.e. $G'_i(t_{j,i}) \leq g_{j,i}$. If the source gain curve is known to the metadata transcoder, then this condition could be reformulated to state that at the time instances of the source gain values, the target gain curve should be smaller or equal to the source gain curve, i.e. $G'_i(t_{j,i}) \leq G_j(t_{j,i})$, with $t'_i < t_{j,i} \leq t'_{i+1}$ and $t_j < t_{j,i} \leq t_{j+1}$. Using the interpolation curves for the target gain segment $G'_i(t)$ and the source gain segment $G_j(t)$ provided above, this inequality can be written:

$$g'_i(1 - W'(t_{j,i} - t'_i)) + g'_{i+1} W'(t_{j,i} - t'_i) \leq g_j(1 - W(t_{j,i} - t_j)) + g_{j+1} W(t_{j,i} - t_j). \quad (15)$$

Defining $W'_{j,i} = W'(t_{j,i} - t'_i)$ to be the value of the interpolation function of the target coding scheme at the time instance $t_{j,i}$, i.e. the time instance which is in the $i^{th}$ curve segment of the target gain curve and in the $j^{th}$ curve segment of the source gain curve. In a similar fashion $W_{j,i} = W(t_{j,i} - t_j)$ can be defined. Using these sample values of the interpolation functions of the source coding scheme and of the target coding scheme, the inequality above can be written as:

$$g'_{i+1} \leq \frac{1}{W'_{j,i}} [g_j(1 - W_{j,i}) + g_{j+1} W_{j,i} - (1 - W'_{j,i}) g'_i]. \quad (16)$$

Similar to the formula provided for the "best match" gain algorithm which uses only the source gain values, this formula provides a recursive method for calculating the target gain value $g'_{i+1}$ based on its preceding target gain value $g'_i$. The resulting algorithm is referred to as the generalized "best match" gain algorithm. It is particular beneficial for situations where $(t'_{i+1} - t'_i) \leq (t_{j+1} - t_j)$, i.e. for situation where the time interval between two adjacent source gain values is larger or equal to the time interval between two adjacent target gain values. As outlined above, for such situations, it may occur that no source gain value $g_{j,i}$ exists for which the condition $t'_i < t_{j,i} \leq t'_{i+1}$ can be met. In such situations, the generalized "best match" gain algorithm would provide an appropriate interpolated gain on the source gain curve and allow the determination of a target gain value $g'_{i+1}$ based on its preceding target gain value $g'_i$ and interpolated source gain values.

Figure 9B:
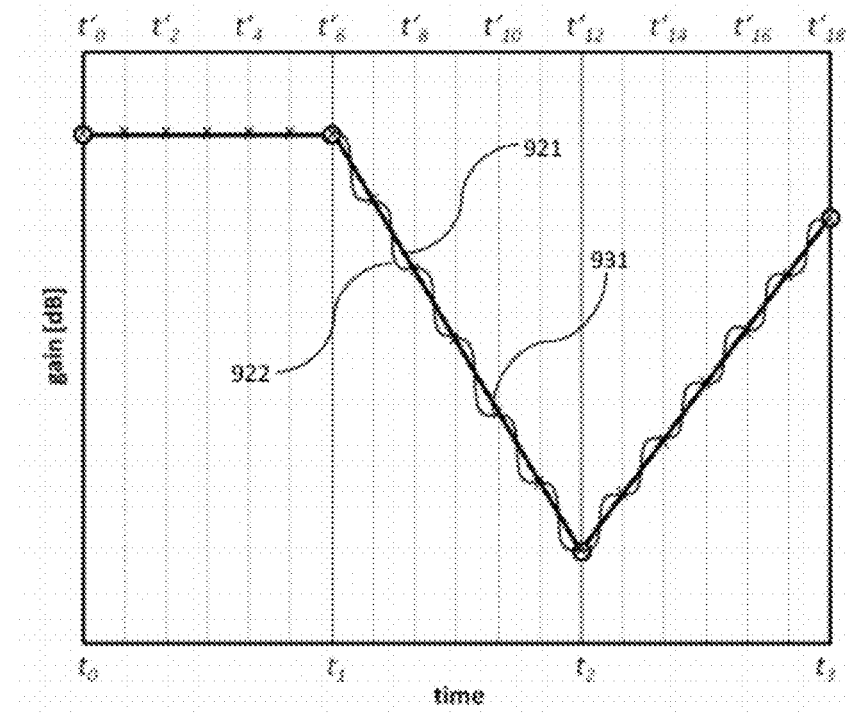

The functionality of the generalized "best match" gain algorithm for situation where $(t'_{i+1} - t'_i) < (t_{j+1} - t_j)$ can be seen in FIG. 9b, where a linearly interpolated gain curve 921 is transcoded into an S-curve interpolated gain curve 922. Such situations may occur, when transcoding HE-AAC gain metadata into AAC or AC-3 gain metadata.

In this particular example, the block size of the source coding scheme is exactly 6 times the block size of the target coding scheme and moreover, the block boundaries exactly overlap, i.e. the time instance of the first target coding block $t'_0$ coincides with the time instance of the first source coding block $t_0$, $t'_6$ coincides with $t_1$, and so on. For the particular case illustrated in FIG. 9b $W'_{j,i}=1$ and the above mentioned recursive formula becomes $g'_{i+1} \leq \lfloor g_j(1-W_{j,i}) + g_{j+1} W_{j,i} \rfloor$. It is a preferred option to select the maximum possible target gain value which in this case corresponds to the value of the source gain curve at the time instance $t'_{i+1}$. This is illustrated in FIG. 9b, where the target gain value $g'_{10}$ at time instance $t'_{10}$ is indicated as the cross 931. Overall, it can be seen that the target gain curve 922 matches quite well the source gain curve 921. It can also be seen that as requested by formula (15) the target gain curve 922 is smaller or equal to the source gain curve 921 at the time instances $t_{j,i}$. On the other hand, due to the S-curved interpolation of the target coding scheme, the target gain curve is sometimes greater than the source gain curve. As highlighted above, such a weakening of the general constraint that the target gain curve should always be smaller or equal to the source gain curve may be beneficial in certain transcoding situations, notably when stronger emphasis is put on an overall matching of the two gain curves.

It should be noted that it may be beneficial to use a combination of the "best match" gain algorithm and the generalized "best match" gain algorithm. By way of example, the "best match" gain algorithm may be used for situations where the block size of the target coding scheme is larger or equal to the block size of the source coding scheme, i.e. among others for transcoding from AC-3 to HE AAC. On the other hand, the generalized "best match" gain algorithm may be used for situations where the block size of the target coding scheme is smaller than the block size of the source coding scheme, i.e. among others for transcoding from HE AAC to AC-3. By combining the algorithms, a tradeoff between computational complexity and matching performance can be made.

Algorithm 3: Interpolation Picking

A further algorithm makes use of an additional DRC gain control functionality provided by MPEG-4 HE AAC which is the so-called gain interpolation scheme. As outlined above, HE AAC allows the selection of different interpolation schemes and to choose from either a linear interpolation between two adjacent gain values or an abrupt, "attack"-like, interpolation at one of eight time instances between two adjacent coding blocks. Therefore, the gain interpolation scheme enables controlling the shape of the gain interpolation curve between two gain control points or gain values. This has been described in the context with graphs 302 and 303 of FIG. 3. It can be seen that the slow interpolation 302 is well suited to model a smooth exponential gain release, whereas the interpolation schemes 303 can model sharp gain attacks.

This observation gives rise to the following algorithm for transcoding a source gain curve into a target gain curve for cases, such as HE AAC, in which the target coding scheme allows the selection of different interpolation schemes or different interpolation curve patterns. The target coding scheme should at least allow the selection of a possibly smooth "release" interpolation curve pattern and a possible abrupt "attack" interpolation curve pattern. The algorithm consists of the steps:

1. Estimating the slope of the source gain curve. This could be done, e.g. by analyzing its first derivative or by calculating the difference between appropriate adjacent source gain values. If the negative slope goes beyond a certain threshold, classifying the current frame as an "attack" (A), otherwise classifying the current frame as a "release" (R).
2. If the current frame has been classified as (R), then determining the next target gain value according to the rank-order filter algorithm outlined above. Furthermore, the smooth or "release" interpolation curve of the target coding scheme is selected.
3. If the current frame has been classified as (A), then determining the next target gain value according to the rank-order filter algorithm outlined above. If the source coding scheme is a transform-based codec such as AAC or AC-3, then the next target gain value can also be selected as the minimum of the target gains centered on the AAC window center. After determining of an appropriate next target gain value, selecting an "attack" interpolation curve pattern of the target coding scheme. Furthermore, if the target coding scheme allows the selection of one of a plurality of "attack" interpolation curve patterns at different time instances, then selecting the "attack" interpolation curve pattern for which the slope is closest to the point where the absolute value of the first derivative of the source gain curve is highest, i.e. the point where the slope is steepest. Depending on the source coding scheme, this point on the source gain curve may be determined by different means. By way of example, for the S-shaped interpolation curves of AAC, the point of the steepest slope between two adjacent source gain values is at midpoint between the two source gain values.

Figure 10:
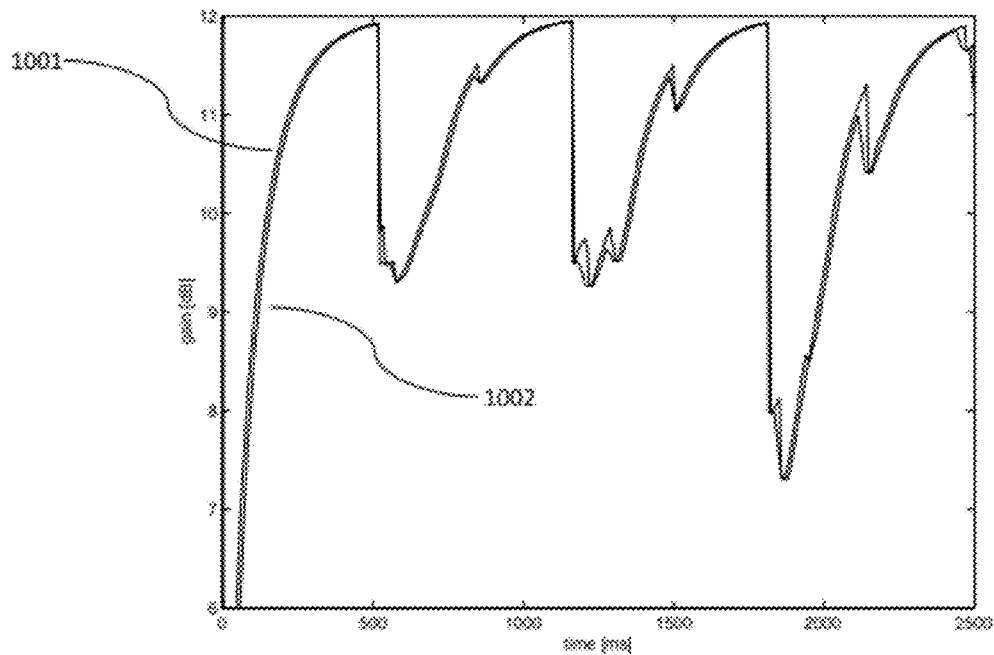
FIG. 10 shows experimental results for the transcoding of gain metadata using a third transcoding algorithm.

FIG. 10 illustrates simulation results for the transcoding of gain metadata from a transform-based coding scheme such as AAC or AC-3 to HE AAC. Graph 1001 shows the source gain curve and graph 1002 the target gain curve. It can be seen that when using the described interpolation picking algorithm, very good gain matching results can be achieved. As a matter of fact, the observed results were better than the results obtained with the described rank-order filter algorithm. Among other things, this is due to the fact that the interpolation picking algorithm additionally uses the functionality of the target coding scheme to choose between different interpolation curves. This selection is performed based on a classification of the source gain curve in "attack" segments and "release" segments. In other words, the interpolation picking algorithm not only takes into account the source gain values and the window and/or the interpolation function of the target coding system, but it also analyzes the course of the source gain curve in order to determine appropriate target gain values and eventually an appropriate target gain curve pattern. In more general terms, it may be said that the interpolation picking algorithm takes into account the source gain values and the window and/or interpolation function of the source decoder as well as the target gain values and the window and/or interpolation function of the target decoder.

The present document provides several algorithms for transcoding gain metadata between a source coding scheme and a target coding scheme. Such transcoding of gain metadata needs to be performed at several occasions between the production center of an audio stream and the final point of emission of the audio stream. The described algorithms allow for a flexible transcoding between different coding schemes having different lengths of coding blocks or frames and different time intervals between adjacent gain values. Furthermore, these lengths of coding blocks may vary at any time and also the time intervals between adjacent gain values may vary at any time within an audio stream. The described algorithms take into account this flexibility of the source and target coding schemes and allow for flexible transcoding between coding schemes of varying block lengths and varying time intervals. In addition, the described algorithms yield a best match between the source gain curves and the target gain curves and may take into account such constraints as that the target gain curve should stay below the source gain curve in order to avoid undesired effects, such as clipping.

Finally, it should be noted that a plurality of algorithms have been described which meet different requirements with regards to computational complexity and the amount of data that is processed within the metadata transcoder. It may be beneficial to perform metadata transcoding purely based on the source gain values available within the metadata bitstream. This will provide a very low complexity transcoding algorithm with reduced processor and memory requirements. This is e.g. the case for the rank-order filter algorithm. Transcoding performance may be improved when additionally considering the interpolation schemes and the window functions of the target coding scheme. This is e.g. the case of the "best-match" gains algorithm and the interpolation picking algorithm. Also in this case, a metadata transcoder may perform transcoding directly based on the information available from the metadata bitstream. As a matter of fact, no detailed knowledge about the source coding scheme would be required at the metadata transcoder. Finally, metadata transcoding may be further improved, if also the interpolation schemes and the window functions of the source coding scheme are considered. This is the case for the generalized rank-order filter algorithm and the generalized "best match" gains algorithm. However, these algorithms require additional information regarding the source coding scheme at the metadata transcoder. Such data may e.g. be stored in the memory of the metadata transcoder and could be limited to selected samples of the window functions. For example, if metadata transcoding is performed within a consumer set-top box, such data may be stored in the memory of the set-top box.

It should be noted that the above mentioned algorithms may be combined in multiple ways. By way of example, it may be beneficial to use one algorithm for particular transcoding situations and swap to another algorithm if the transcoding situation changes. Such changing transcoding situations may occur when the block size of a coding scheme changes, e.g. from long blocks to short blocks. Furthermore, the interpolation conditions may change when different window functions are applied. It should therefore be understood that various combinations of the described algorithms are considered to be part of the present invention. In addition to selecting an appropriate transcoding algorithm for a particular transcoding situation, it may also be beneficial to adapt the available parameters, such as the parameter β of the rank-order filter algorithm, to the particular transcoding situation. By way of example, if the length of the coding blocks changes from long frames to short frames on the source coding scheme or the target coding scheme, then it may be appropriate to modify the time interval applied in the rank-order algorithm.

In general terms, it is to be understood, that the algorithms described in the present document, as well as their associated parameters, may be applied in any combination and may be changed "on the fly" on a block per block basis, in order to adapt to current and continuously changing transcoding situations.

The invention claimed is:

1. A method for transcoding audio gain metadata related to dynamic range control from first gain metadata of a first audio coding scheme to second gain metadata of a second audio coding scheme, wherein the first and second audio coding schemes use coding blocks wherein the coding blocks of the first and second audio coding schemes cover different lengths of time of an encoded audio signal; and each coding block has at least one associated gain value; and wherein the method comprises the step of:

selecting a gain value of the second gain metadata based on gain values of the first gain metadata such that, within a time interval around the time instance associated with the gain value of the second gain metadata, the minimum gain value of the first gain metadata is selected.

2. The method according to claim 1, wherein an upper and a lower limit of the time interval are determined by a time constant which is respectively added to and subtracted from the time instance associated with the gain value of the second gain metadata.

3. The method according to claim 2, wherein the coding blocks of the first and second audio coding schemes cover certain lengths of time of an encoded audio signal and wherein the time constant is greater or equal to the maximum of the length of time of the coding blocks of the first audio coding scheme; and the length of time of the coding blocks of the second audio coding scheme.

4. The method according to claim 2, wherein the coding blocks of the first and second audio coding schemes cover certain lengths of time of an encoded audio signal and wherein the time constant is smaller than the maximum of the length of time of the coding blocks of the first audio coding scheme; and the length of time of the coding blocks of the second audio coding scheme.

5. The method according to claim 1, further comprising the step of:

if no gain value of the first gain metadata falls within the time interval around the time instance associated with the gain value of the second gain metadata, then selecting the gain value of the second gain metadata to be the gain value of the second gain metadata associated with the coding block which precedes the coding block associated with the gain value of the second gain metadata.

6. The method according to claim 1, further comprising the step of:

if no gain value of the first gain metadata falls within the time interval around the time instance associated with the gain value of the second gain metadata, then selecting the gain value of the second gain metadata to be the gain value of the first gain metadata which immediately precedes the time interval.

7. The method according to claim 1, wherein the second audio coding scheme allows the selection of different interpolation curves which interpolate adjacent gain values of the second gain metadata to form a second gain curve; and wherein the method further comprises the step of:

selecting an appropriate interpolation curve between two adjacent gain values of the second gain metadata based on the gain values of the first gain metadata.

8. The method according to claim 7, wherein the appropriate interpolation curve is selected based on the difference between two adjacent gain values of the first gain metadata.

9. The method according to claim 7, wherein a first gain curve is associated with the gain values of the first gain metadata; and the first gain curve is obtained by interpolating adjacent gain values of the first gain metadata; and the method comprises the further step of:
selecting the appropriate interpolation curve between two adjacent gain values of the second gain metadata based on the slope of the first gain curve.

10. The method according to claim 9, comprising the further steps of:
if the negative slope of the first gain curve is above a pre-defined threshold value, detecting a gain attack;
if the negative slope of the first gain curve is below a pre-defined threshold value, detecting a gain release; and
selecting the appropriate interpolation curve between two adjacent gain values of the second gain metadata based on a detected gain attack or a gain release of the first gain curve.

11. The method according to claim 10, wherein the method comprises the further step of:
selecting the appropriate interpolation curve between two adjacent gain values of the second gain metadata based on the position where the absolute value of the slope of the first gain curve is maximum.

12. The method according to claim 1, wherein
a first gain curve is associated with the gain values of the first gain metadata; and
the method comprises the further step of selecting the minimum value of the first gain curve within the time interval as the gain value of the second gain metadata.

13. The method according to claim 1, wherein
a first gain curve is associated with the gain values of the first gain metadata; and
the method comprises the further step of selecting the minimum value of a set of samples of the first gain curve within the time interval as the given gain value of the second gain metadata.

14. The method according to claim 13, wherein
the set of samples of the first gain curve corresponds to the samples of the first gain curve at time instances associated with the coding blocks of the second gain values falling within the time interval.

15. A method for transcoding audio gain metadata related to dynamic range control from first gain metadata of a first audio coding scheme to second gain metadata of a second audio coding scheme, wherein
the first and second audio coding schemes have different numbers of audio samples per coding block;
each coding block has at least one associated gain value; and
a series of gain values of adjacent coding blocks is interpolated to define a gain curve; and
wherein the method comprises the step of: selecting the gain values of the second gain metadata based on gain values of the first gain metadata such that the second gain curve is below the first gain curve.

16. A method for transcoding audio gain metadata related to dynamic range control from first gain metadata of a first audio coding scheme to second gain metadata of a second audio coding scheme, wherein
the first and second audio coding schemes use coding blocks wherein the coding blocks of the first and second audio coding schemes cover different lengths of time of an encoded audio signal;
each coding block has at least one associated gain value; and
a second gain curve is associated with the gain values of the second gain metadata; and
wherein the method comprises the step of: selecting the gain values of the second gain metadata such that, at time instances associated with the coding blocks of the first audio coding scheme, the second gain curve is smaller or equal to the gain values of the first gain metadata.

17. The method according to claim 16, wherein
a first gain curve is associated with the gain values of the first gain metadata; and
the method comprises the step of: selecting the gain values of the second gain metadata such that, at time instances associated with the coding blocks of the first audio coding scheme and at time instances associated with the coding blocks of the second audio coding scheme, the second gain curve is smaller or equal to the first gain curve.

18. The method according to claim 17, wherein
the first gain curve consists of segments associated with adjacent first gain values and a first window function; and
the second gain curve consists of segments associated with adjacent second gain values and a second window function.

19. A transcoding system for transcoding audio gain metadata related to dynamic range control from first gain metadata of a first audio coding scheme to second gain metadata of a second audio coding scheme, wherein
the first and second audio coding schemes use coding blocks wherein the coding blocks of the first and second audio coding schemes cover different lengths of time of an encoded audio signal; and
each coding block has at least one associated gain value; and
wherein the transcoding system is configured to select a gain value of the second gain metadata based on the gain values of the first gain metadata such that within a time interval around the time instance associated with the gain value of the second gain metadata, the minimum gain value of the first gain metadata is selected.

20. A transcoding system for transcoding audio gain metadata related to dynamic range control from first gain metadata of a first audio coding scheme to second gain metadata of a second audio coding scheme, wherein
the first and second audio coding schemes have different numbers of audio samples per coding block;
each coding block has an associated gain value; and
a series of gain values of adjacent coding blocks is interpolated to define a gain curve; and
wherein the transcoding system is configured to select the gain values of the second gain metadata based on gain values of the first gain metadata such that the second gain curve is below the first gain curve.

21. A transcoding system for transcoding audio gain metadata related to dynamic range control from first gain metadata of a first audio coding scheme to second gain metadata of a second audio coding scheme, wherein
the first and second audio coding schemes use coding blocks wherein the coding blocks of the first and second audio coding schemes cover different lengths of time of an encoded audio signal;
each coding block has an associated gain value; and
a second gain curve is associated with the gain values of the second gain metadata; and
wherein the transcoding system is configured to select the gain values of the second gain metadata such that, at time instances associated with the coding blocks of the first audio coding scheme, the second gain curve is smaller or equal to the gain values of the first gain metadata.

22. A computer program product comprising:
a tangible non-transitory computer-readable storage medium; and
executable instructions stored within the storage medium that when executed by a processor are operable to:
transcode audio gain metadata related to dynamic range control from first gain metadata of a first audio coding scheme to second gain metadata of a second audio coding scheme;
wherein:
the first and second audio coding schemes use coding blocks wherein the coding blocks of the first and second audio coding schemes cover different lengths of time of an encoded audio signal;
each coding block has at least one associated gain value; and
to transcode the audio gain metadata, the instructions include instructions to select a gain value of the second gain metadata based on gain values of the first gain metadata such that, within a time interval around the time instance associated with the gain value of the second gain metadata, the minimum gain value of the first gain metadata is selected.

23. A computer program product comprising:
a tangible non-transitory computer-readable storage medium; and
executable instructions stored within the storage medium that when executed by a processor are operable to:
transcode audio gain metadata related to dynamic range control from first gain metadata of a first audio coding scheme to second gain metadata of a second audio coding scheme;
wherein:
the first and second audio coding schemes have different numbers of audio samples per coding block;
each coding block has at least one associated gain value;
a series of gain values of adjacent coding blocks is interpolated to define a gain curve; and
to transcode the audio gain metadata, the instructions include instructions to select the gain values of the second gain metadata based on gain values of the first gain metadata such that the second gain curve is below the first gain curve.

24. A computer program product comprising:
a tangible non-transitory computer-readable storage medium; and
executable instructions stored within the storage medium that when executed by a processor are operable to:
transcode audio gain metadata related to dynamic range control from first gain metadata of a first audio coding scheme to second gain metadata of a second audio coding scheme;
wherein:
the first and second audio coding schemes use coding blocks wherein the coding blocks of the first and second audio coding schemes cover different lengths of time of an encoded audio signal;
each coding block has at least one associated gain value; and
a second gain curve is associated with the gain values of the second gain metadata; and
to transcode the audio gain metadata, the instructions include instructions to select the gain values of the second gain metadata such that, at time instances associated with the coding blocks of the first audio coding scheme, the second gain curve is smaller or equal to the gain values of the first gain metadata.

25. A set-top box for decoding a received multimedia signal, the set-top box comprising:
a receiver for receiving a multimedia signal in a first coding scheme;
a transcoding unit for transcoding the multimedia signal in the first coding scheme into a multimedia signal in a second coding scheme; and
a transmitter for transmitting the transcoded multimedia signal;
wherein the transcoding unit transcodes audio gain metadata related to dynamic range control from first gain metadata of the first coding scheme to second gain metadata of the second coding scheme, wherein
the first and second audio coding schemes use coding blocks wherein the coding blocks of the first and second audio coding schemes cover different lengths of time of an encoded audio signal; and
each coding block has at least one associated gain value; and
wherein the transcoding unit selects a gain value of the second gain metadata based on the gain values of the first gain metadata such that within a time interval around the time instance associated with the gain value of the second gain metadata, the minimum gain value of the first gain metadata is selected.

26. A set-top box for decoding a received multimedia signal, the set-top box comprising:
a receiver for receiving a multimedia signal in a first coding scheme;
a transcoding unit for transcoding the multimedia signal in the first coding scheme into a multimedia signal in a second coding scheme; and
a transmitter for transmitting the transcoded multimedia signal;
wherein the transcoding unit transcodes audio gain metadata related to dynamic range control from first gain metadata of the first coding scheme to second gain metadata of the second coding scheme, wherein
the first and second audio coding schemes have different numbers of audio samples per coding block;
each coding block has an associated gain value; and
a series of gain values of adjacent coding blocks is interpolated to define a gain curve; and
wherein the transcoding unit selects the gain values of the second gain metadata based on gain values of the first gain metadata such that the second gain curve is below the first gain curve.

27. A set-top box for decoding a received multimedia signal, the set-top box comprising:
a receiver for receiving a multimedia signal in a first coding scheme;
a transcoding unit for transcoding the multimedia signal in the first coding scheme into a multimedia signal in a second coding scheme; and
a transmitter for transmitting the transcoded multimedia signal;
wherein the transcoding unit transcodes audio gain metadata related to dynamic range control from first gain metadata of the first coding scheme to second gain metadata of the second coding scheme, wherein
the first and second audio coding schemes use coding blocks wherein the coding blocks of the first and second audio coding schemes cover different lengths of time of an encoded audio signal;

each coding block has an associated gain value; and a second gain curve is associated with the gain values of the second gain metadata; and wherein the transcoding system selects the gain values of the second gain metadata such that, at time instances associated with the coding blocks of the first audio coding scheme, the second gain curve is smaller or equal to the gain values of the first gain metadata.

28. The method according to claim 1, wherein the first and second audio coding scheme is one of: Dolby E, Dolby Digital, AAC, HE AAC.

29. The method according to claim 15, wherein the first and second audio coding scheme is one of: Dolby E, Dolby Digital, AAC, HE AAC.

30. The method according to claim 16, wherein the first and second audio coding scheme is one of: Dolby E, Dolby Digital, AAC, HE AAC.

* * * * *